United States Patent
Tsuji

(10) Patent No.: US 8,188,833 B2
(45) Date of Patent: May 29, 2012

(54) VARIABLE RESISTANCE ELEMENT AND MANUFACTURING METHOD OF THE SAME

(75) Inventor: Kiyotaka Tsuji, Osaka (JP)

(73) Assignee: Panasonic Corporation, Osaka (JP)

( * ) Notice: Subject to any disclaimer, the term of this patent is extended or adjusted under 35 U.S.C. 154(b) by 68 days.

(21) Appl. No.: 12/994,916

(22) PCT Filed: Apr. 14, 2010

(86) PCT No.: PCT/JP2010/002702

§ 371 (c)(1),
(2), (4) Date: Nov. 29, 2010

(87) PCT Pub. No.: WO2010/119677

PCT Pub. Date: Oct. 21, 2010

(65) Prior Publication Data

US 2011/0074539 A1    Mar. 31, 2011

(30) Foreign Application Priority Data

Apr. 14, 2009    (JP) .................................. 2009-097837

(51) Int. Cl.
*H01C 7/10*    (2006.01)
(52) U.S. Cl. ............ 338/20; 338/21; 438/102; 438/398; 438/200; 257/4; 257/246; 365/148
(58) Field of Classification Search .................... 338/20, 338/21
See application file for complete search history.

(56) References Cited

U.S. PATENT DOCUMENTS

| | | | | |
|---|---|---|---|---|
| 6,482,657 B2 * | 11/2002 | Shimazawa | ...................... | 438/3 |
| 6,939,722 B2 * | 9/2005 | Okazawa et al. | .................. | 438/3 |
| 2004/0085833 A1 * | 5/2004 | Hwang et al. | .................. | 365/200 |
| 2008/0006907 A1 | 1/2008 | Lee et al. | | |
| 2008/0037105 A1 | 2/2008 | Van Bommel et al. | | |
| 2008/0157053 A1 * | 7/2008 | Lai et al. | ........................... | 257/4 |

(Continued)

FOREIGN PATENT DOCUMENTS

JP    9-331027    12/1997

(Continued)

OTHER PUBLICATIONS

International Search Report issued Jul. 20, 2010 in International (PCT) Application No. PCT/JP2010/002702.

*Primary Examiner* — Kyung Lee
(74) *Attorney, Agent, or Firm* — Wenderoth, Lind & Ponack, L.L.P.

(57) ABSTRACT

A variable resistance element capable of increasing stability of a resistance changing operation and reducing a current necessary for changing, to a low resistance state for the first time, the variable resistance element in an initial state immediately after manufacture. The variable resistance element includes: a first electrode (101); a memory cell hole (150) formed above the first electrode (101); a first variable resistance layer (201) covering a bottom of the memory cell hole (150) and an upper surface of the first electrode (101); a second variable resistance layer (202) formed on the first variable resistance layer (201); and a second electrode (102) formed on the memory cell hole (150), in which a thickness of the first variable resistance layer (201) at the bottom of the memory cell hole (150) gradually decreases toward an edge area of the memory cell hole (150) and has a local minimum value around the edge area of the memory cell hole (150). Furthermore, an oxygen concentration in the first variable resistance layer (201) is higher than an oxygen concentration in the second variable resistance layer (202).

15 Claims, 17 Drawing Sheets

U.S. PATENT DOCUMENTS

| | | |
|---|---|---|
| 2009/0096568 A1 | 4/2009 | Hosoi et al. |
| 2009/0174519 A1 | 7/2009 | Mikawa et al. |
| 2009/0200640 A1 | 8/2009 | Hosoi et al. |
| 2010/0038615 A1 | 2/2010 | Nakagawa |
| 2010/0090193 A1 | 4/2010 | Mikawa et al. |
| 2010/0225438 A1 | 9/2010 | Wei et al. |

FOREIGN PATENT DOCUMENTS

| | | |
|---|---|---|
| JP | 2008-016557 | 1/2008 |
| JP | 2008-016854 | 1/2008 |
| JP | 2008-503788 | 2/2008 |
| JP | 4166820 | 10/2008 |
| JP | 2008-306011 | 12/2008 |
| JP | 2009-043850 | 2/2009 |
| WO | 2006-000996 | 1/2006 |
| WO | 2006/075574 | 7/2006 |
| WO | 2007/116749 | 10/2007 |
| WO | 2007/125668 | 11/2007 |
| WO | WO 2008/047711 | 4/2008 |
| WO | 2008/062623 | 5/2008 |

\* cited by examiner (a)

(b)

(a)

(b)

(a)

(b)

(a)

(b)

TaOy(100nm) After film formation (a)

(b)

(a)

(b)

(a)

(b)

(a)

(b)

(a)

(b)

(a)

(b)

VARIABLE RESISTANCE ELEMENT AND MANUFACTURING METHOD OF THE SAME

TECHNICAL FIELD

The present invention relates to variable resistance elements having a resistance value that is stable when held and changes in response to an application of a voltage pulse. In particular, the present invention relates to a variable resistance element capable of reducing a current necessary for an initial breakdown operation (an operation to lower a resistance by applying a voltage higher than a voltage applied in a usual operation to change a resistance) necessary to change a state of an element before a first operation immediately after manufacture into a state in which a resistance can be changed, and a manufacturing method of the same.

BACKGROUND ART

Recent years have seen increased high performance in electronic devices such as mobile information devices and information appliances following the development of digital technology. As such, there is an increasing demand for higher-capacity, reduced writing power consumption, increased speed during writing and reading, and extended operational life of nonvolatile storage elements.

In view of these demands, flash memories using existing floating gates have increasingly been miniaturized.

On the other hand, in the case of non-volatile semiconductor storage elements (variable resistance memory) using, for a storage unit, a variable resistance element having a resistance value that is stable when held and changes in response to an application of a voltage pulse, there are expectations for further miniaturization, increased speed, reduced power consumption, and so on, because a memory cell can be simply configured.

PTL 1 discloses a configuration example of a variable resistance element suitable to miniaturization and higher integration. According to the PTL 1, a variable resistance layer and an upper electrode are filled in a via hole formed above a lower electrode. In addition, the upper electrode is convexed toward the variable resistance layer. With the above-described configuration, it is considered that malfunction of the variable resistance element can be reduced.

[Citation List]
 [Patent Literature]
[PTL 1]
Japanese Patent No. 4166820

SUMMARY OF INVENTION

Technical Problem

A variable resistance element is known to include a variable resistance layer sandwiched between a first electrode and a second electrode, and to have a resistance that changes due to a change in the resistance of the variable resistance layer in the vicinity of an interface between the first electrode and the variable resistance layer or an interface between the second electrode and the variable resistance layer, depending on a variable resistance material, through application of a voltage having a different polarity between the first electrode and the second electrode. Oxygen-deficient transition metal oxides are used often for the variable resistance material described above. The oxygen-deficient transition metal oxide is a transition metal oxide that mostly indicates insulation properties and has an oxygen content lower than a stoichiometric composition, and has semiconducting or conducting characteristics.

It is necessary, in order to stably change the resistance of a variable resistance element, to limit a region in which the resistance changes in the variable resistance layer to one of: the vicinity of the interface between the first electrode and the variable resistance layer; and the vicinity of the interface between the second electrode and the variable resistance layer. A method for the above includes a method of forming a variable resistance layer in the vicinity of the interface of one electrode whose resistance is desired to be changed to have an oxygen content higher than an oxygen content of a variable resistance layer in the vicinity of the interface of the other electrode in a manufacturing process. With the above configuration, the resistance changes preferentially in the vicinity of the interface of the electrode having a higher oxygen content, and it is possible to further ensure the operation to change a resistance in the vicinity of the interface of the electrode having a higher oxygen content, by setting the resistance value in the vicinity of the interface of the electrode having a higher oxygen content immediately after manufacture at a value higher than a resistance value in a high resistance state in a usual operation to change a resistance. Since an initial resistance value of a variable resistance element immediately after manufacture made through this method indicates a value higher than a value in a high resistance state of usual operation to change a resistance, it is necessary, when used as a variable resistance element, to first apply a voltage higher than that used in a usual resistance change to change the resistance value of the variable resistance element to be a low value.

However, with the configuration of the element disclosed by PTL 1, since the resistance of the variable resistance layer does not differ between the vicinity of the interface of the upper electrode and the vicinity of the interface of the lower electrode, it is unclear in which vicinity of the interface of the electrodes the resistance changes, and thus there is a problem in operation stability. In other words, when a positive voltage is applied to the upper electrode, the resistance either increases or decreases. Furthermore, it is necessary to set the resistance of the variable resistance layer itself at a high value when manufacturing the element, in order to set the initial resistance to have a value higher than a resistance value in a high resistance state of usual operation to change a resistance, with this configuration. In this case, the voltage increases which is necessary for an initial break down operation (an operation to decrease a resistance by applying a voltage higher than a voltage applied in a usual operation to change a resistance) necessary to change a state of an element before a first operation after manufacture into a state in which a resistance can be changed. In addition, when a variable resistance layer is formed evenly, a current generally flows through the entire bottom surface of a via hole that contains the variable resistance layer. Accordingly, when the voltage necessary to decrease the resistance increases, a current necessary for the above-described initial breakdown increases, entailing a size increase for a transistor connected to the variable resistance element. There is thus a problem that the capacity of a memory that can be mounted on a chip is reduced.

An object of the present invention is to provide a variable resistance element and the like having a configuration which solves the problems described above, increases stability of an operation to change a resistance, and reduces a current necessary for the initial breakdown.

Solution to Problem

In order to achieve the object described above, an aspect of a variable resistance element according to the present invention is a variable resistance element including: a substrate; a first electrode formed above the substrate; an interlayer insulating layer formed above the substrate; a first variable resistance layer formed on the first electrode in a memory cell hole that is formed to penetrate through the interlayer insulating layer; a second variable resistance layer formed on the first variable resistance layer in the memory cell hole; and a second electrode covering at least a top of the memory cell hole and electrically connected to at least the second variable resistance layer, wherein an electrical resistance value between the first electrode and the second electrode changes in response to application of a predetermined voltage or current between the first electrode and the second electrode, a thickness of the first variable resistance layer at a bottom of the memory cell hole gradually decreases from a center area toward an edge area of the memory cell hole and has a local minimum value around the edge area of the memory cell hole, and an oxygen concentration in the first variable resistance layer is higher than an oxygen concentration in the second variable resistance layer.

Here, as a more detailed aspect, the interlayer insulating layer may be formed above the first electrode, and the memory cell hole may be formed to penetrate through the interlayer insulating layer and to reach an upper surface of the first electrode. Furthermore, as another detailed aspect, a first wiring pattern may be formed above the substrate, the memory cell hole may be formed to penetrate through the interlayer insulating layer and to reach an upper surface of the first wiring pattern, and the first electrode may be formed at least at the bottom of the memory cell hole and above the first wiring pattern.

With the above-described configuration, an initial breakdown current flows concentrating in a region in which the thickness of the first variable resistance layer becomes local minimum, thereby producing an advantageous effect that a current necessary for changing for the first time, to the low resistance state can be reduced.

In addition, with the configuration in which the second variable resistance layer is filled to the upper surface of the memory cell hole, it is possible to prevent a foreign material from entering the memory cell hole in a manufacturing processing subsequent to a formation of the second electrode even when the second electrode does not completely cover the memory cell hole. Thus, it is possible to obtain advantageous effects of preventing miniaturization of the element and lowering in reliability for the element due to the foreign material remaining in the memory cell hole.

It is to be noted that the thickness of the first variable resistance layer at the bottom of the memory cell hole is the thickness of a portion of the first variable resistance layer facing the bottom of the memory cell hole, and includes both cases where the first variable resistance layer contacts with the bottom of the memory cell hole and where the first variable resistance layer does not contact with the bottom of the memory cell hole.

Furthermore, the first electrode may be formed directly on an upper surface of a wiring pattern formed under the first electrode. With the above-described configuration, it is possible to integrate the first electrode with the wiring pattern of the transistor circuit. Thus, it is possible to produce advantageous effects of simplifying forming processes and lowering costs which include reduction in: a connecting via for the circuit wiring and the first electrode of the variable resistance element; the number of masks; and so on.

Furthermore, a wiring pattern may be formed directly on the second electrode. With the above-described configuration, it is possible to integrate the second electrode with the wiring pattern of the transistor circuit. Thus, it is possible to produce advantageous effects of simplifying forming processes and lowering costs which include reduction in: a connecting via for the circuit wiring and the second electrode of the variable resistance element; the number of masks; and so on.

In addition, a wiring pattern may be arranged under the memory cell hole and the first electrode may be formed only on the wiring pattern at the bottom of the memory cell hole. The configuration described above eliminates the necessity of patterning process for the first electrode, thereby allowing miniaturization.

Furthermore, the thickness of the second variable resistance layer filled in the memory cell hole may be reduced, and a filled layer may further be formed on the variable resistance layer to fill the memory cell hole. The above-described configuration produces an advantageous effect that a voltage necessary for changing, for the first time, to the lower resistance state can be reduced.

It is to be noted that the present invention is not only embodied as a variable resistance element but also as a manufacturing method of the variable resistance element.

An aspect of a manufacturing method according to the present invention includes: forming a first electrode above a substrate; depositing an interlayer insulating layer above the substrate and the first electrode; forming a memory cell hole in the interlayer insulating layer such that an upper surface of the first electrode is exposed to a bottom of the memory cell hole; depositing a first variable resistance layer on the bottom and side wall of the memory cell hole and on the interlayer insulating layer, the first variable resistance layer having, at the bottom of the memory cell hole, a thickness that gradually decreases from a center area toward an edge area of the memory cell hole and having a local minimum value around the edge area of the memory cell hole; depositing a second variable resistance layer on the first variable resistance layer; removing the first variable resistance layer and the second variable resistance layer deposited above the interlayer insulating layer, using chemical mechanical polishing, to form the first and second variable resistance layers in the memory cell hole; and forming a second electrode above the memory cell hole and the interlayer insulating layer after the removing using the chemical mechanical polishing.

Furthermore, another aspect of a manufacturing method according to the present invention includes: forming a first wiring pattern above a substrate; depositing an interlayer insulating layer above the substrate and the first wiring pattern; forming a memory cell hole in the interlayer insulating layer such that an upper surface of the first wiring pattern is exposed to a bottom of the memory cell hole; forming a first electrode at the bottom of the memory cell hole and on the upper surface of the first wiring pattern; depositing a first variable resistance layer at the bottom of the memory cell hole and on the first electrode, and on the side wall of the memory cell hole and on the interlayer insulating layer, the first variable resistance layer having, at the bottom of the memory cell hole, a thickness that gradually decreases from a center area toward an edge area of the memory cell hole and having a local minimum value around the edge area of the memory cell hole; depositing a second variable resistance layer on the first variable resistance layer; removing the first variable resistance layer and the second variable resistance layer deposited above the interlayer insulating layer, using chemical mechanical polishing, to form the first and second variable resistance layers in the memory cell hole; and forming a second electrode above the memory cell hole and the interlayer insulating layer after the removing using the chemical mechanical polishing.

ADVANTAGEOUS EFFECTS OF INVENTION

The variable resistance element according to the present invention is formed such that the resistance of the variable resistance layer in the vicinity of one electrode whose resistance is desired to be changed is higher than the resistance of the other electrode, and that the variable resistance layer having a higher resistance include, by design, a thick portion and a thin portion, and thus it is possible to stably start resistance changing operation and reduce a current necessary for an initial breakdown.

DESCRIPTION OF EMBODIMENTS

The following is a description of embodiments according to the present invention, with reference to the drawings. It is to be noted that the same numerals are applied for the same elements and a description therefor may be omitted.

In the present invention, when a structure is formed above a substrate, it applies to both cases of forming the structure directly on the substrate and forming the structure above the substrate with another structure interposed therebetween, according to a general understanding. Furthermore, the expression "interlayer insulating layer" refers to both of the interlayer insulating layer formed in one process in manufacturing processing of a non-volatile storage element and the interlayer insulating layer formed by integrating multiple interlayer insulating layers formed separately in respective multiple processes in manufacturing processing of a non-volatile storage element. Furthermore, the expression "viewed from a thickness direction of a substrate" means "viewed from a thickness direction of a substrate perspectively or not perspectively".

(Embodiment 1)

An aspect of a variable resistance element according to the present invention is a variable resistance element including: a substrate; a first electrode formed above the substrate; an interlayer insulating layer formed above the substrate; a first variable resistance layer formed on the first electrode in a memory cell hole that is formed to penetrate through the interlayer insulating layer; a second variable resistance layer formed on the first variable resistance layer in the memory cell hole; and a second electrode covering at least a top of the memory cell hole and electrically connected to at least the second variable resistance layer, wherein an electrical resistance value between the first electrode and the second electrode changes in response to application of a predetermined voltage or current between the first electrode and the second electrode, a thickness of the first variable resistance layer at a bottom of the memory cell hole gradually decreases from a center area toward an edge area of the memory cell hole and has a local minimum value around the edge area of the memory cell hole, and an oxygen concentration in the first variable resistance layer is higher than an oxygen concentration in the second variable resistance layer. Among such variable resistance elements, the variable resistance element according to Embodiment 1 of the present invention is a variable resistance element in which the interlayer insulating layer is formed on the first electrode, the memory cell hole penetrates through the interlayer insulating layer to reach the upper surface of the first electrode. The following describes specifically the variable resistance element according to Embodiment 1 of the present invention.

Figure 1:
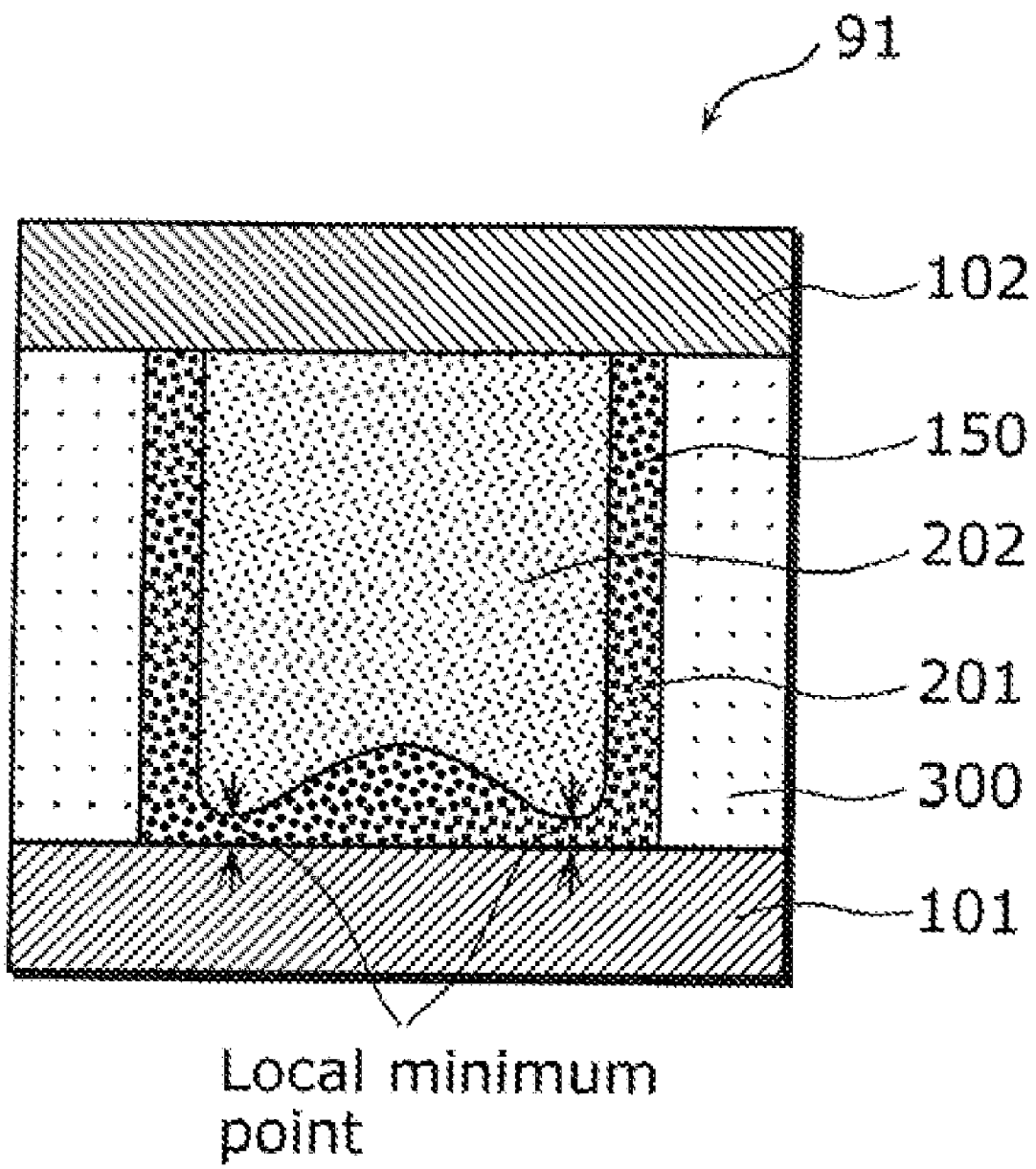
FIG. 1 is a cross sectional view of an example of a configuration of a variable resistance element according to Embodiment 1 of the present invention.

FIG. 1 is a cross sectional view which shows an example of a variable resistance element 91 according to Embodiment 1 of the present invention.

As shown in FIG. 1, the variable resistance element 91 according to the present embodiment includes: a first electrode 101; a interlayer insulating layer 300 formed on the first electrode; a memory cell hole 150 formed in the interlayer insulating layer 300 and having a bottom that reaches an upper surface of the first electrode 101; a first variable resistance layer 201 filled to cover at least the bottom of the memory cell hole 150 and electrically connected to the upper surface of the first electrode 101; a second variable resistance layer 202 formed on the first variable resistance layer 201 in the memory cell hole; and a second electrode 102 formed to cover the top of the memory cell hole 150 and electrically connected to the second variable resistance layer 202. Furthermore, the oxygen concentration in the first variable resistance layer 201 is higher than the oxygen concentration in the second variable resistance layer 202. It is to be noted that the substrate above which the variable resistance element 91 is formed is not illustrated in FIG. 1 and not illustrated in other embodiments as well.

Furthermore, the oxygen concentration in the first variable resistance layer 201 is set such that a resistance value of the variable resistance element 91 before a first resistance changing operation (an initial resistance value after manufacture) according to the present embodiment is higher than a resistance value in a high resistance state in a usual resistance changing operation. Here, the "usual resistance changing operation" is an operation which causes the variable resistance element to reversibly change between a high resistance state and a low resistance state and which is performed by a non-volatile storage element.

Furthermore, as shown in FIG. 1, when a thickness of the bottom of the first variable resistance layer 201 is defined as a thickness in a direction perpendicular to the upper surface of the first electrode 101, a thickness distribution of the bottom of the first variable resistance layer 201 is as follows: the thickness gradually decrease from the center toward an edge area of the memory cell hole 150 and has a local minimum point around the edge area of the memory cell hole 150. The "bottom of the first variable resistance layer 201" here is a portion (surface) of the first variable resistance layer 201, which faces the bottom of the memory cell hole 150. In addition, "around the edge area of the memory cell hole 150" may be any position between a central axis of the memory cell hole 150 and an inner face of the memory cell hole 150, and it is preferable that a distance between the position and the inner face is smaller than a distance between the position and the central axis.

More specifically, the thickness of the first variable resistance layer 201 is 16 nm at the center of the bottom of the memory cell hole 150 and 10 nm at the local minimum point, according to the present embodiment. It is to be noted that the thickness above is shown as an example, and it is only necessary for the thickness of the first variable resistance layer 201 included in the variable resistance element according to the present invention at the bottom of the memory cell hole 150 to have a local minimum point. It is considered, however, it is preferable that the thickness at the center is equal to or more than one and a half times the thickness at the local minimum point.

A variable resistance element whose resistance value before a first resistance changing operation is higher than a resistance value in a high resistance state in a usual resistance changing operation and achieves resistance changing operation by decreasing the resistance value from the above-described state, as the variable resistance element 91 according to the present embodiment, is defined here as an initial breakdown element.

With the initial breakdown element, it is necessary to apply a current (an initial breakdown current) having a certain value or more, by applying a voltage (an initial breakdown voltage) higher than that in the usual resistance changing operation, when decreasing the resistance value in the high resistance state before the first operation.

With the conventional configuration having a memory cell hole whose thickness is even at the bottom, a significantly high initial breakdown current is required because the initial breakdown current flows the entire bottom of the memory cell hole.

On the other hand, the initial breakdown current flows concentrating in the region in which the thickness of the first variable resistance layer 201 becomes local minimum according to the present embodiment, and thus it is possible to reduce the initial breakdown current.

Figure 2:
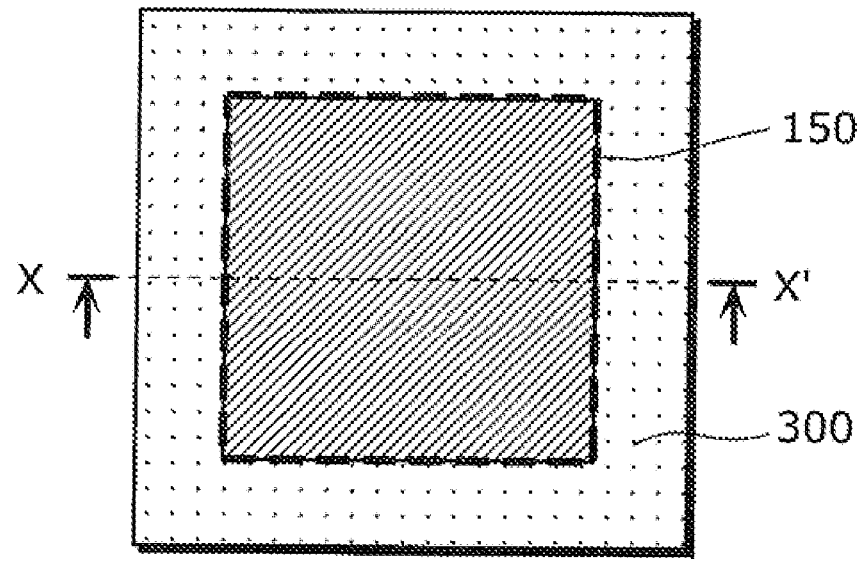
FIG. 2(a) is a plan view showing a process of forming a memory cell hole in a manufacturing method of the variable resistance element according to Embodiment 1 of the present invention.
FIG. 2(b) is a cross sectional view of FIG. 2(a).
Figure 2:
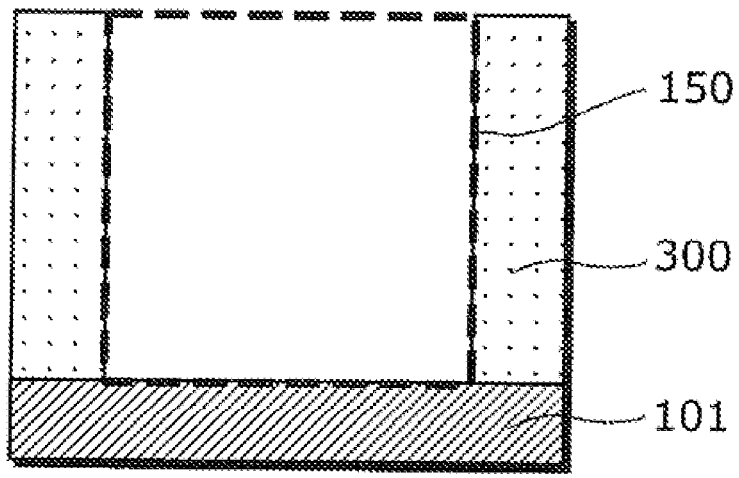
Figure 5:
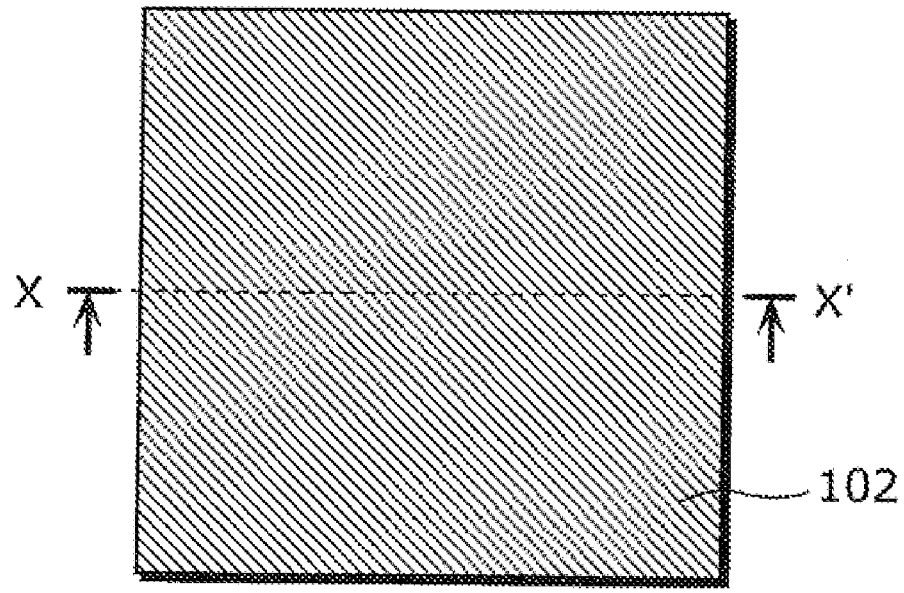
FIG. 5(a) is a plan view showing a process of forming a second electrode in the manufacturing method of the variable resistance element according to Embodiment 1 of the present invention.
FIG. 5(b) is a cross sectional view of FIG. 5(a).
Figure 5:
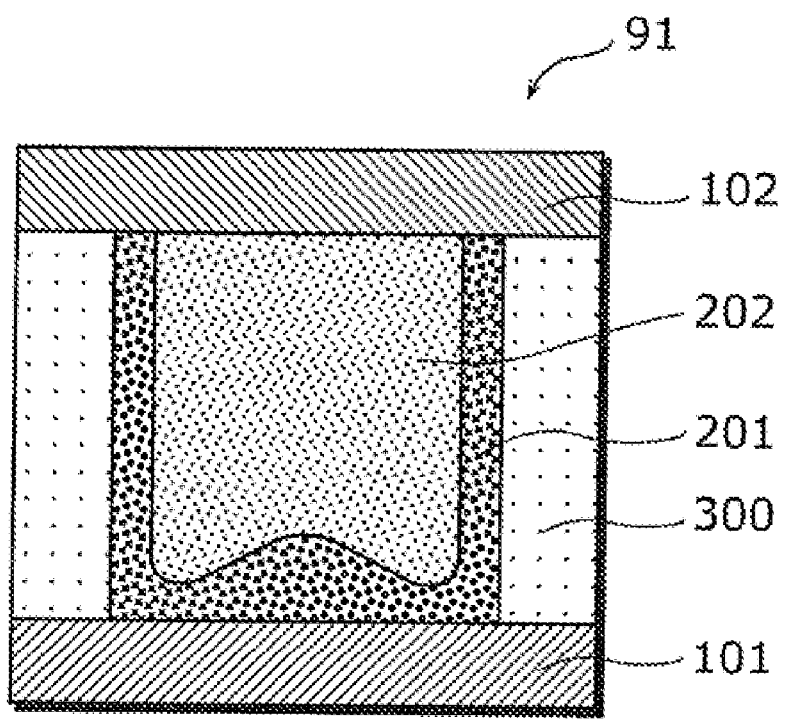

The following describes a manufacturing method of the variable resistance element 91 according to Embodiment 1, with reference to FIGS. 2(a) and (b) to FIGS. 5(a) and (b). In each diagram, (a) is a plan view of the variable resistance element and (b) is a cross sectional view of (a) taken along the line X-X' viewed from a direction of the arrows.

First, a conductive layer is deposited using sputtering, CVD, or the like above a substrate (not illustrated), and then the first electrode 101 is formed by masking using photolithography process and then etching. It is preferable that noble metal materials such as platinum (Pt), palladium (Pd), or iridium (Ir), or a mixture of these materials are used for the first electrode 101 so that the electrode sufficiently elicits the function of the first variable resistance layer 201, that is, the electrode facilitates a change in the resistance. A standard electrode potential of these electrode materials is higher than a standard electrode potential of a transition metal composing a variable resistance layer, and thus these electrode materials are difficult to oxidize. When a positive voltage is applied to these electrodes, oxygen ions in the variable resistance layer localize in the vicinity of the interface between the variable resistance layer and each of the electrodes as a concentrated oxygen layer, causing the variable resistance element 91 to change to the high resistance state. On the other hand, when a negative voltage is applied, the oxygen ions localizing in the vicinity of the interface diffuse into the entire variable resistance layer that is a main body of the variable resistance element 91, causing the variable resistance element 91 to change to the low resistance state. In view of the mechanism described above, it is possible to obtain a stable resistance changing operation by arranging the above-described noble metal materials on the side in which resistance change is desired. The electrode material is not limited to the above-described materials as long as the material has a standard electrode potential higher than a standard electrode potential of a transition metal composing the variable resistance material.

The iridium (Ir) is employed in the present embodiment. In addition, the dimension of the first electrode' 101 is 1.0 µm×1.0 µm and the thickness is 50 nm.

In addition, although not illustrated in a diagram, when the variable resistance element 91 of the present embodiment is used as a storage element for an integrated circuit, a substrate including in advance a transistor circuit or the like is used and the first electrode 101 and a via hole for an electrical connection to the transistor circuit are connected. This also applies to the description in Embodiment 3 and Embodiment 5 described below.

Next, the interlayer insulating layer 300 including TEOS (Tetra Ethyl Ortho Silicate)-SiO is deposited for 800 nm using the CVD method, for example, and the interlayer insulating layer on the first electrode 101 is polished to have a thickness of 300 nm using a chemical mechanical polishing (CMP) method, for example, thereby roughly planarizing the surface.

It is to be noted that a silicon nitride (SiN) film, a silicon carbon nitride film (SiCN) which is a low dielectric constant material, a silicon-oxycarbite film (SiOC), a fluorine-doped silicon oxide film (SiOF), or the like may be used for the interlayer insulating layer 300, other than the TEOS-SiO. In addition, a stacking configuration may be employed using these materials.

Then, the memory cell hole 150 having a diameter of 520 nm and reaching the upper surface of the first electrode 101 is formed in the interlayer insulating layer 300 (See FIGS. 2(a) and (b)). More specifically, the memory cell hole 150 is formed in the interlayer insulating layer 300 and a part of the upper surface of the first electrode 101 is exposed to the bottom of the memory cell hole 150. The formation of the above can easily be achieved using a technology used in ordinary semiconductor processes (photolithography, etching, and so on).

Figure 3:
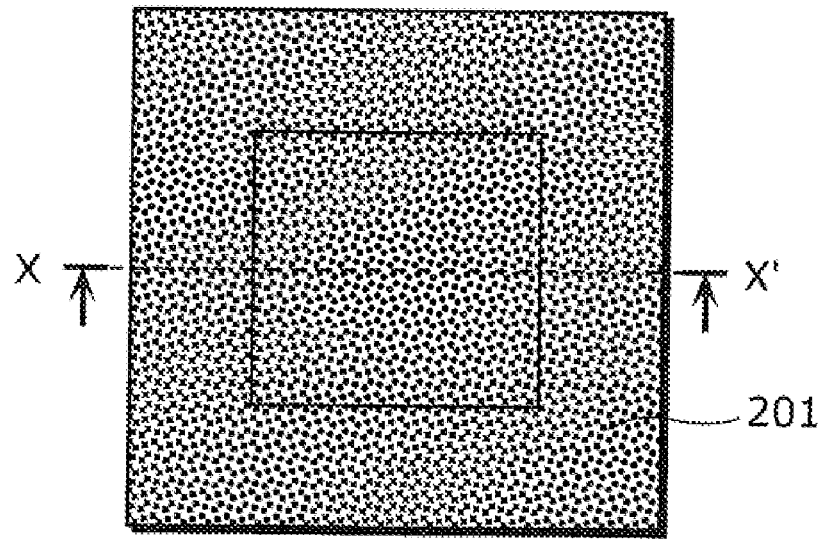
FIG. 3(a) is a plan view showing a process of forming a first variable resistance layer in the manufacturing method of the variable resistance element according to Embodiment 1 of the present invention.
FIG. 3(b) is a cross sectional view of FIG. 3(a).
Figure 3:
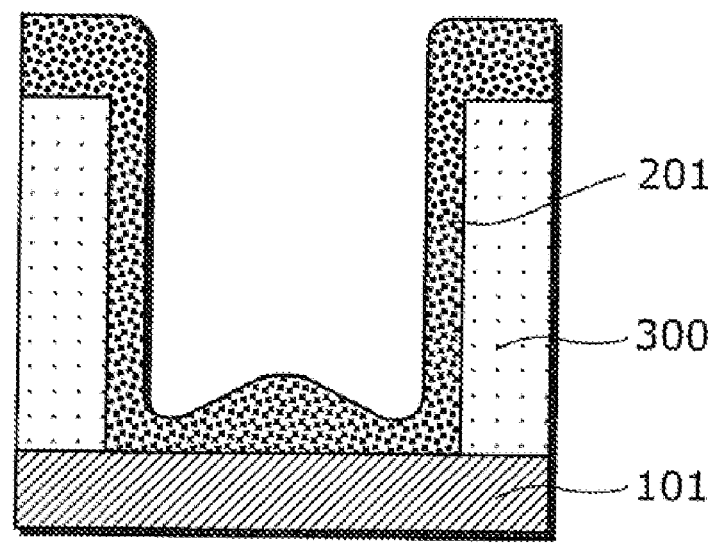

Next, the first variable resistance layer 201 is formed to cover the inner face of the memory cell hole 150 and the entire surface of the interlayer insulating layer 300 as shown in FIGS. 3(a) and (b). The first variable resistance layer 201 is an oxygen-deficient oxide having smaller oxygen content in a ratio of the number of atoms than an oxide having a stoichiometric composition. More specifically, the first variable resistance layer 201 is deposited on the bottom and side wall of the memory cell hole 150 and the interlayer insulating layer 300, such that the thickness at the bottom of the memory cell hole 150 gradually decreases from a center area toward an edge area of the memory cell hole 150 and has a local minimum value around the edge area of the memory cell hole 150. Here, the case of using the tantalum oxide is described. The following describes a formation process. It is preferable that a range for the first variable resistance layer 201 is $TaO_y$ (where $2.1 \leq y \leq 2.5$) and the thickness at the local minimum value is 1 nm or larger and 8 nm or smaller. It is to be noted that the value y in a chemical formula $TaO_y$ can be adjusted by adjusting an oxygen gas flow ratio with respect to an argon gas flow at the time of sputtering.

The following describes sputtering processing in detail. First, a substrate is set in a sputtering device, and the inside of the sputtering device is vacuumed to approximately $7 \times 10^{-4}$ Pa. Then, the sputtering is performed with tantalum used as the target, power set at 250 W, the total gas pressure including argon gas and oxygen gas set at 3.3 Pa, and a preset temperature of the substrate set at 30 degrees Celsius. When an oxygen partial pressure is changed from 1% to 7%, an oxygen content in the tantalum oxide layer changes from approximately 40% ($TaO_{0.66}$) to approximately 70% ($TaO_{2.3}$). The composition of the tantalum oxide layer can be measured using Rutherford backscattering spectrometry. In addition, in the case of the tantalum oxide, an oxide having a stoichiometric composition (stoichiometry) refers here to $Ta_2O_5$ that is an insulator, and a metal oxide become conductive by changing the oxide into an oxygen-deficient oxide.

Furthermore, it is possible to deposit the first variable resistance layer 201 such that the first variable resistance layer 201 has a thickness distribution at the bottom of the memory cell hole 150, by using a method of which molecules which are deposited have a high directivity in a depositing direction, such as long throw sputtering, and depositing with the substrate being tilt with respect to the depositing direction of the molecules which are deposited and with the substrate caused to rotate.

Figure 6:
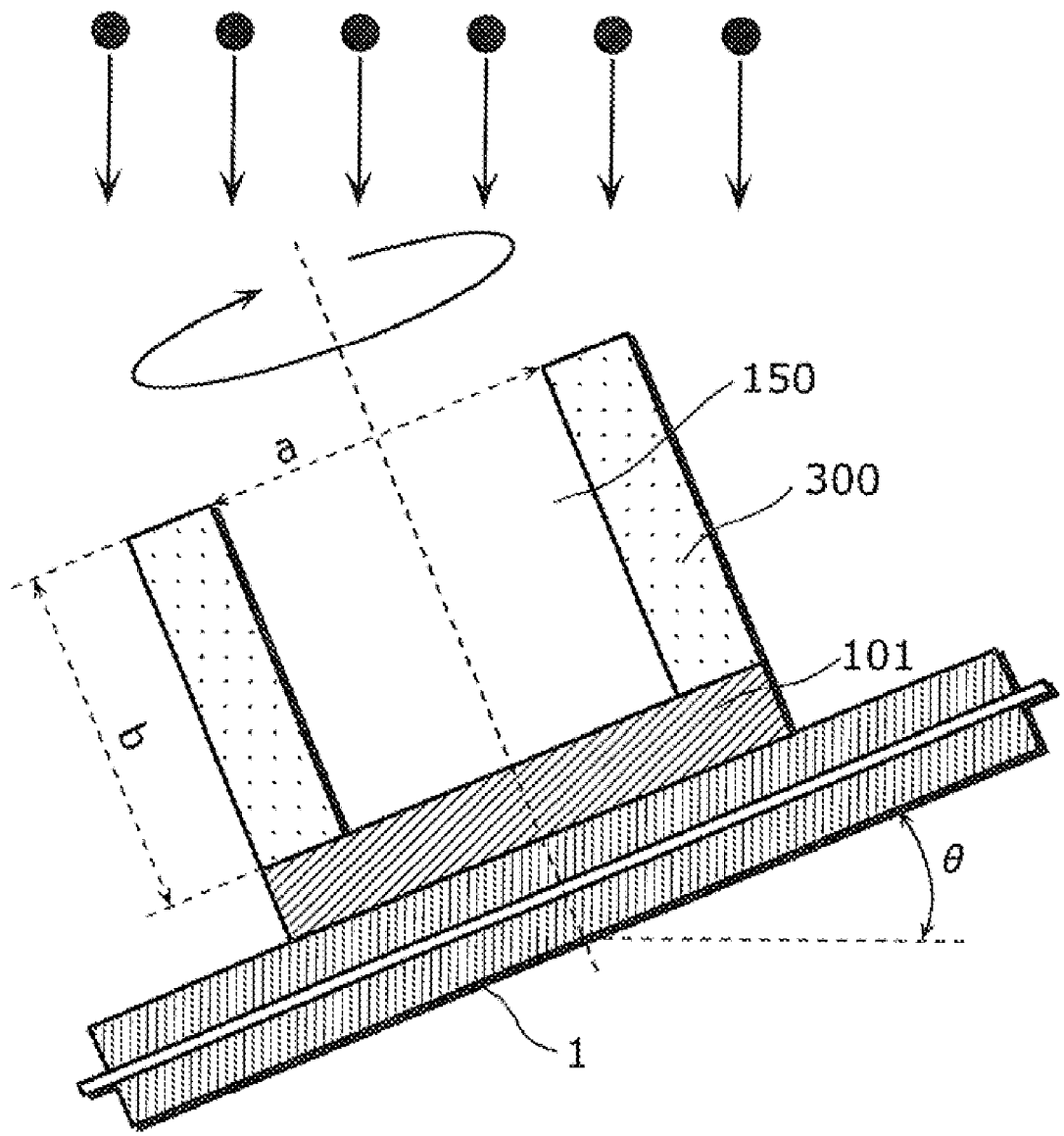
FIG. 6 is a schematic diagram which explains a film formation method of the first variable resistance layer according to the present invention.

A film formation condition of the depositing method is described with reference to FIG. 6. As shown in FIG. 6, it is possible to form the first variable resistance layer 201 such that the variable resistance layer 201 gradually changes from the center of the memory cell hole 150 toward an edge area of the memory cell hole 150 and has a local minimum point around the edge area of the memory cell hole 150, by satisfying the following expression:

$$0° < \theta \leq \arctan(a/2b) \quad \text{(Expression 1)}$$

where a denotes the dimension of an opening of the memory cell hole 150 at an uppermost surface, b denotes the height of the memory cell hole 150, and θ denotes a tilt angle of the substrate 1 with respect to a depositing direction of molecules to be deposited. More specifically, materials of the first variable resistance layer 201 are deposited on the interlayer insulating layer 300 and in the memory cell hole 150 by inclining the substrate with respect to the depositing direction of deposited molecules, from a state in which the surface of the substrate is vertical, by more than 0° and arctan (a/2b) or less, and causing the substrate to rotate. In addition, it is possible to adjust change in the thickness at the bottom of the memory cell hole 150 by changing θ. The change in the thickness becomes smaller (nearly flat) as θ is closer to 0° and greater as θ is greater, however, it is effective that $10° \leq \theta \leq 0.9 \arctan(a/2b)$ is desirably satisfied.

Figure 7:
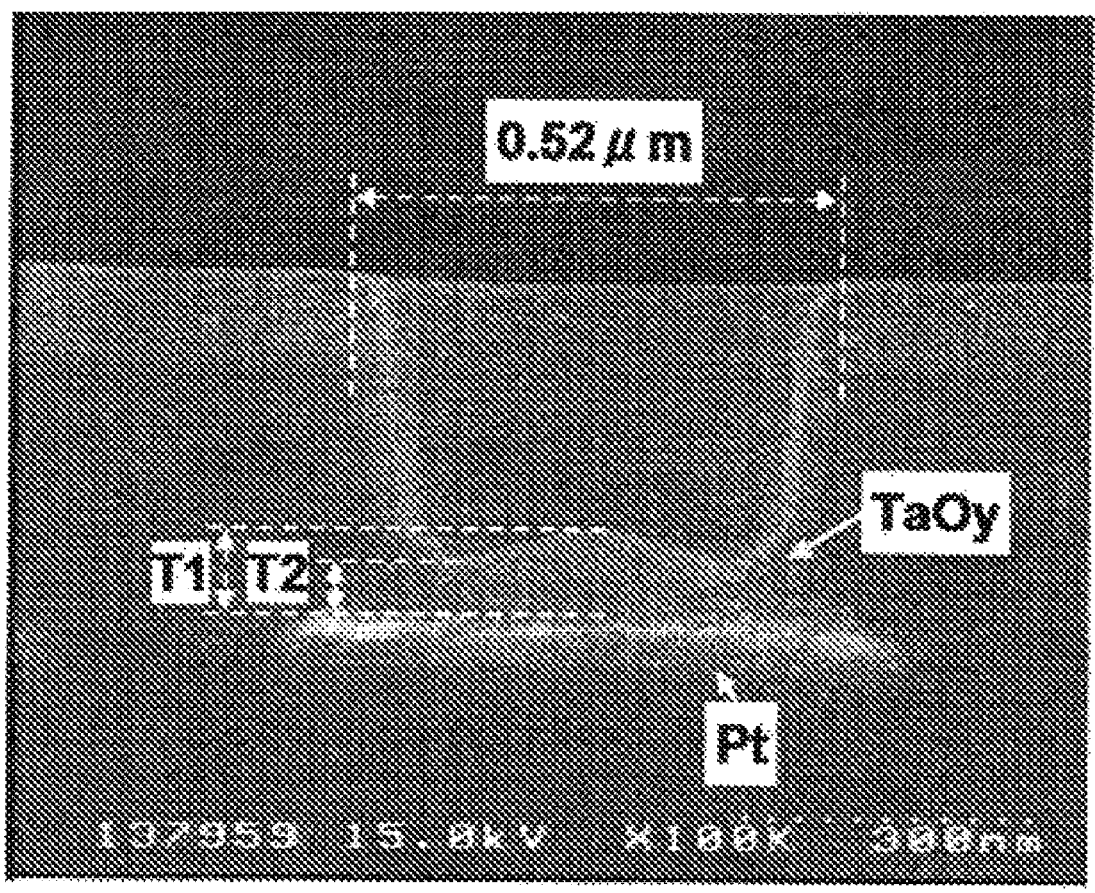
FIG. 7 is a cross sectional SEM photograph showing a result of a film formation of the first variable resistance layer in a memory cell hole, using the film formation method of the first variable resistance layer according to the present invention.

FIG. 7 shows a result of film formation for the thickness equivalent of 100 nm when measured on a flat substrate of an oxygen-deficient tantalum oxide ($TaO_y$) having smaller oxygen content in an atomic ratio than an oxide having a stoichiometric composition, as the first variable resistance layer material, under the condition of a=0.52 µm, b=250 nm, and θ=45°. It is confirmed that the thickness T2 at the local minimum point around the edge area of the bottom of the memory cell hole is approximately 60% of the thickness T1 at the center of the bottom of the memory cell hole.

In the present embodiment, the first variable resistance layer 201 is formed such that the thickness of the first variable resistance layer 201 at the local minimum point in the bottom of the memory cell hole 150 is 10 nm.

Next, a tantalum oxide ($TaO_x$) having an oxygen content lower than that of the first variable resistance layer 201 is deposited on the first variable resistance layer 201 using the same method as in depositing the first variable resistance layer 201 as a second variable resistance layer 202. It is desirable that the composition of the second variable resistance layer 202 is $TaO_x$ ($0.8 \leq x \leq 1.9$). At this time, since the film for deposit needs to fill the entire memory cell hole 150, it is desirable that the tilt angle of the substrate at the time of deposition is approximate to 0°, and the deposition film needs to be thick enough to sufficiently bury the memory cell hole. Thus, the tilt angle is set at 0° and the deposition thickness when measured on the flat substrate is set at 500 nm according to the present embodiment. As described above, by first forming the first variable resistance layer 201 and then forming the second variable resistance layer 202 in the memory cell hole, an advantageous effect that the first variable resistance layer that is important for resistance change can be protected from electrical or chemical damage in dry etching processing can be expected as well.

Figure 4:
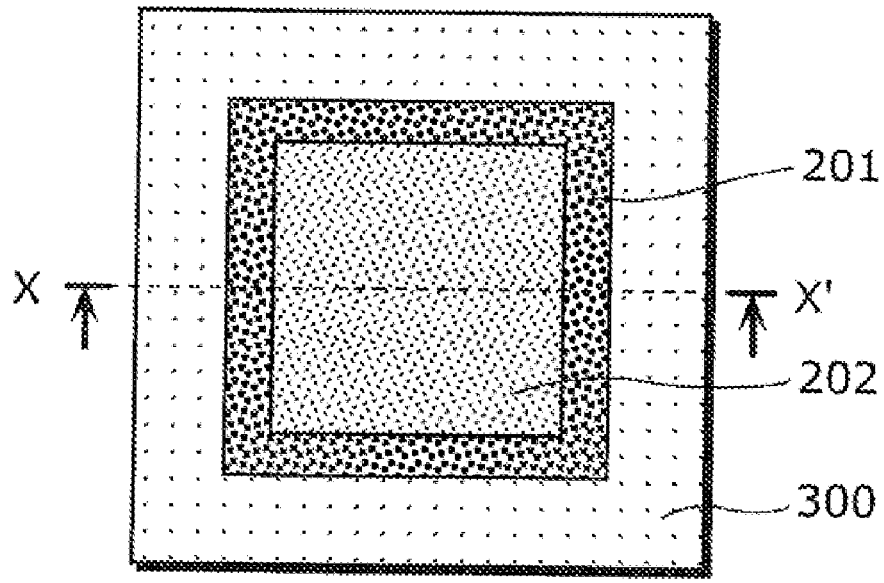
FIG. 4(a) is a plan view showing a process of forming a second variable resistance layer and the first variable resistance layer in the manufacturing method of the variable resistance element according to Embodiment 1 of the present invention.
FIG. 4(b) is a cross sectional view of FIG. 4(a).
Figure 4:
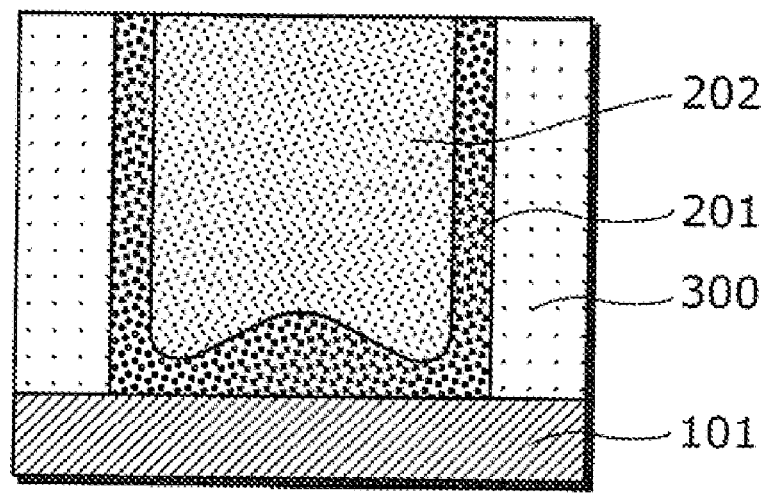

Then, as shown in FIGS. 4(a) and (b), the CMP is performed until the surface of the interlayer insulating layer 300 is exposed and the surface is roughly planarized, thereby forming the first variable resistance layer 201 and the second variable resistance layer 202. In the CMP at this time, it is desirable that the polishing rate of the first variable resistance layer 201 is higher than the polishing rate of the interlayer insulating layer 300, from the standpoint of processing stability. In the present embodiment, an acidic slurry is used that is generally used in the CMP of tungsten (W).

Next, as shown in FIGS. 5(a) and (b), the second electrode 102 is formed on the memory cell hole 150 and the interlayer insulating layer 300 through the following processing.

A conductive layer is deposited on the surface shown in FIGS. 4(a) and (b) using the sputtering method or the CVD method, and then masking is performed using the photolithography process and then etching is performed.

The same material as the first electrode 101 can be used for the second electrode 102, however, copper (Cu), titanium (Ti), tungsten (W), tantalum (Ta), titanium nitride (TiN), tungsten nitride (WN), or tantalum nitride (TaN) may be used as an electrode which facilitates keeping the resistance near the interface between the second variable resistance layer 202 and the second electrode 102 in a low state, that is, as an electrode with which resistance is not easily changed. In addition, the sputtering method and the CVD method are used for film formation method for these materials.

In the present embodiment, tantalum nitride (TaN) is used for the second electrode 102, and the dimension and the thickness are set at 1.0 μm×1.0 μm and 50 nm, respectively.

In addition, although not illustrated in FIGS. 5(a) and (b), when the variable resistance element 91 according to the present embodiment is used as a storage element for an integrated circuit, a substrate including in advance a transistor circuit or the like is used and an interlayer insulating layer and, for example, tungsten via are further formed on the second electrode 102. They can be formed easily using a general semiconductor processing. This tungsten via is connected using a wiring pattern to, for example, a tungsten via formed so as to be electrically connected to the transistor circuit in the substrate. This also applies to the description in Embodiment 2, Embodiment 4, and Embodiment 5 described below.

It is to be noted that, in the present embodiment, the shape of the first electrode 101, the second electrode 102, and the memory cell hole 150 are shown as square in planar view, however, the shape is not limited to this, and the same advantageous effect can be obtained by employing a shape of rectangle, oval, circle, polygon, or the like. This also applies to the description in Embodiment 2 and Embodiments described below.

The following describes the advantageous effect of the variable resistance element 91 according to the present invention.

Figure 8:
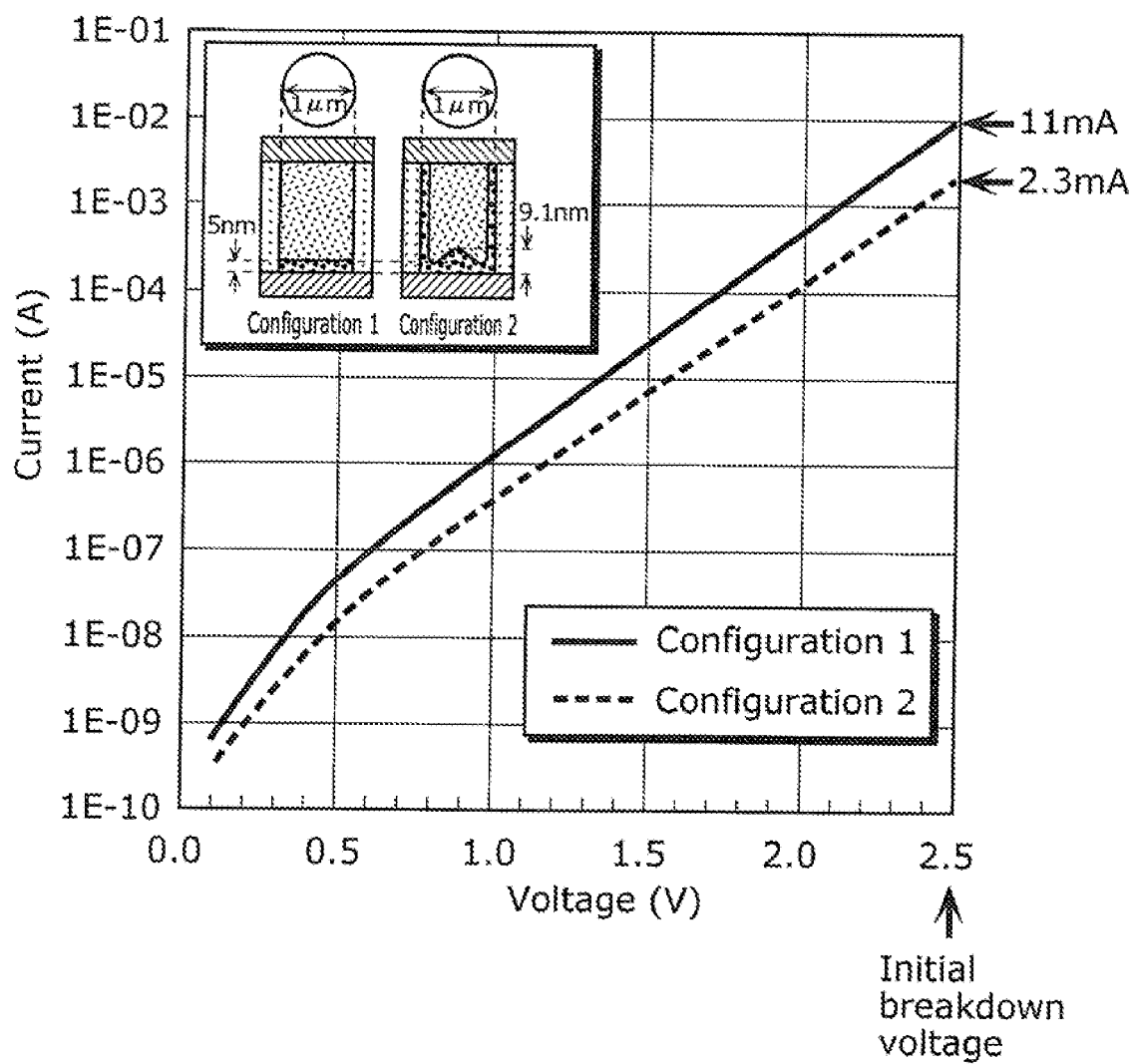
FIG. 8 is a diagram which shows voltage-current characteristics in a high resistance state of the variable resistance element before a first operation according to the present invention, calculated by computation simulation.

FIG. 8 shows a result of comparing, via simulated calculation, current-voltage characteristics in the initial resistance state of the variable resistance element 91 configured according to the present invention, with current-voltage characteristics in the initial resistance state of the variable resistance element conventionally configured, based on data obtained by inventors from experiment. A configuration 1 is a variable resistance element in a conventional configuration and a configuration 2 is the variable resistance element 91 in the configuration according to the present invention.

Here, $TaO_{2.5}$ is used for the first variable resistance layer, $TaO_{1.9}$ is used for the second variable resistance layer, Ir is used for the first electrode, and TaN is used for the second electrode.

In addition, the first variable resistance layer of the configuration 1 is an even film having the thickness of 5 nm and the first variable resistance layer of the configuration 2 has the thickness of 9.1 nm at the center of the memory cell hole and 5 nm at a local minimum point around the edge area of the memory cell hole. In addition, the shape of the memory cell hole is circle with a diameter of 1 μm in both of the configuration 1 and the configuration 2.

With the configuration in which a metal oxide having an even thickness and a higher oxygen content is disposed on a variable resistance side near one electrode and a metal oxide having a lower oxygen content is disposed on a side near the other electrode as in the configuration 1 used in the simulated calculation, an initial breakdown occurs when an applied voltage reaches a certain value. This initial breakdown voltage is determined by the thickness of the metal oxide having a higher oxygen content. In the case where $TaO_{2.5}$ of 9.1 nm is used as in the configuration of this example, the initial breakdown voltage is 2.5V and a current rapidly increases after an initial breakdown (only the current-voltage characteristics immediately before the initial breakdown is calculated in FIG. 8).

FIG. 8 shows that the initial breakdown current in the variable resistance element of the configuration 1 is 11 mA, whereas in the variable resistance element 91 of the configuration 2 according to an aspect of the present invention, the initial breakdown current is 2.3 mA, which is a decrease to approximately 21%.

As described above, the configuration according to Embodiment 1, that is, the configuration in which the thickness of the first variable resistance layer 201 decreases from the center of the memory cell hole 150 toward an edge area of the memory cell hole 150 and has a local minimum value around the edge area, makes it possible to reduce an initial breakdown current.

(Embodiment 2)

Figure 9:
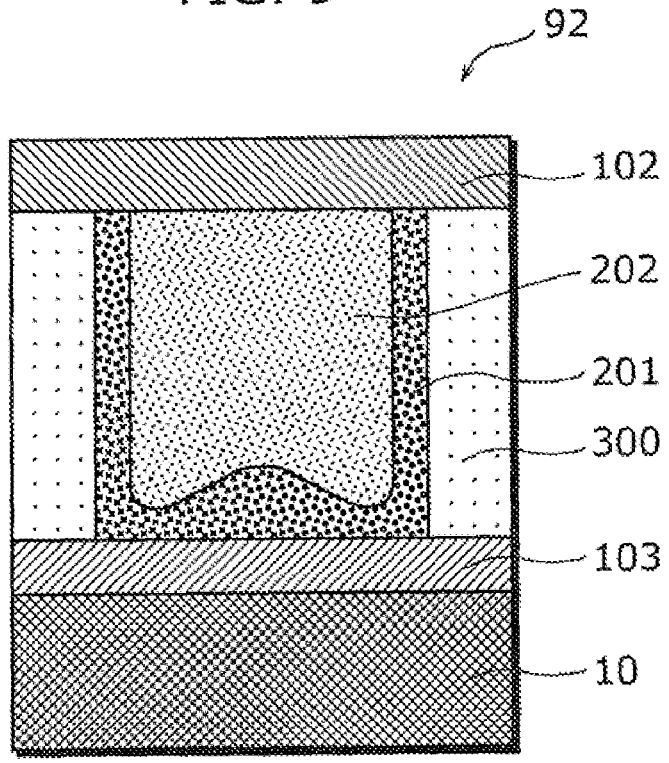
FIG. 9 is a cross sectional view of an example of a configuration of a variable resistance element according to Embodiment 2 of the present invention.

FIG. 9 is a cross sectional view which shows an example of a variable resistance element 92 according to Embodiment 2 of the present invention.

The difference between the variable resistance element 92 according to the present embodiment and the variable resistance element 91 according to Embodiment 1 is that the first electrode 103 is formed to be connected to an upper surface of a lower wiring pattern 10.

This configuration is formed by making the conductive layer deposited to form the first electrode 101 according to Embodiment 1 as a stacked film having a film of a lower wiring pattern material on the lower side and a film of the first electrode material on the upper side. The lower wiring pattern 10 and the first electrode 103 are formed by masking using exposure processing and etching the stacked film.

The same material as that used for the first electrode 101 according to Embodiment 1 can be used for the first electrode 103, and Ir having the thickness of 50 nm is used in the present embodiment. Furthermore, materials such as Al, Cu, Al—Cu alloy, Ti—Al—N alloy, or the like can be used for the lower wiring pattern 10, and Al film deposited by sputtering and having the thickness of 200 nm to 400 nm and the width of approximately 1.0 µm is used in the present embodiment.

Next, the interlayer insulating layer 300 including TEOS-SiO is deposited for the thickness of 1200 nm using the CVD, for example, and the interlayer insulating layer on the first electrode 103 is polished to have a thickness of 300 nm using a chemical mechanical polishing (CMP), for example, thereby roughly planarizing the surface.

Subsequent forming processing is the same as in Embodiment 1, and thus the description therefor is omitted.

It is possible to integrate the lower wiring pattern 10 with the wiring pattern of the transistor circuit by forming the first electrode 103 directly on the upper surface of the lower wiring pattern 10, thereby producing advantageous effects of simplifying forming processes and lowering costs which include reduction in: a connecting via for the circuit wiring and the first electrode of the variable resistance element 92; the number of masks; and so on.

The advantageous effects resulting from forming the first electrode 103 directly on the upper surface of the lower wiring pattern 10 can be obtained in Embodiment 3 and Embodiment 5 as well.

(Embodiment 3)

Figure 10:
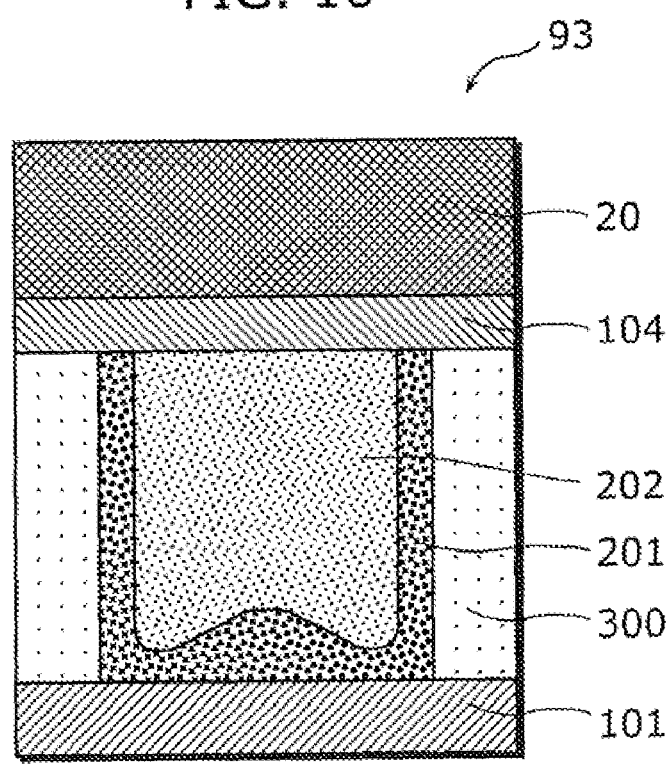
FIG. 10 is a cross sectional view of an example of a configuration of a variable resistance element according to Embodiment 3 of the present invention.

FIG. 10 is a cross sectional view which shows an example of a variable resistance element 93 according to Embodiment 3 of the present invention.

The difference between the variable resistance element 93 according to the present embodiment and the variable resistance element 91 according to Embodiment 1 is that the second electrode 104 is formed to be connected to a lower surface of an upper wiring pattern 20.

Forming processing from the start to the first variable resistance layer 201 and the second variable resistance layer 202 (FIGS. 4(a) and (b)) are the same as in Embodiment 1, the same name is applied to components common in Embodiment 1 and Embodiment 3, and the description therefor is omitted.

A conductive layer that is the second electrode is deposited on the surface shown in FIGS. 4(a) and (b) using the sputtering method, the CVD method, or the like, and then a conductive layer that is the upper wiring pattern is further deposited using the sputtering method, the CVD method, or the like. Then, the second electrode 104 and the upper wiring pattern 20 are formed by masking using photolithography process and then etching the stacked film.

The same material as that used for the second electrode 102 according to Embodiment 1 can be used for the second electrode 104, and TaN having the thickness of 50 nm is used in the present embodiment. Furthermore, materials such as Al, Cu, Al—Cu alloy, Ti—Al—N alloy, or the like can be used for the upper wiring pattern 20, and Al film deposited by sputtering and having the thickness of 200 nm to 400 nm and the width of approximately 1.0 µm is used in the present embodiment.

It is possible to integrated the lower wiring pattern 20 with the wiring pattern of the transistor circuit by forming the second electrode 104 directly on the lower surface of the upper wiring pattern 20, thereby producing advantageous effects of simplifying forming processes and lowering costs which include reduction in: a connecting via for the wiring pattern and the second electrode of the variable resistance element 93; the number of masks; and so on.

The advantageous effects resulting from forming the second electrode 104 directly on the lower surface of the upper wiring pattern 20 can be obtained in Embodiment 4 and Embodiment 5 described below as well.

(Embodiment 4)

A variable resistance element according to Embodiment 4 of the present invention is, among variable resistance elements including: a substrate; a first electrode formed above the substrate; an interlayer insulating layer formed above the substrate; a first variable resistance layer formed on the first electrode in a memory cell hole that is formed to penetrate through the interlayer insulating layer; a second variable resistance layer formed on the first variable resistance layer in the memory cell hole; and a second electrode covering at least a top of the memory cell hole and electrically connected to at least the second variable resistance layer, wherein an electrical resistance value between the first electrode and the second electrode changes in response to application of a predetermined voltage or current between the first electrode and the second electrode, a thickness of the first variable resistance layer at a bottom of the memory cell hole gradually decreases from a center area toward an edge area of the memory cell hole and has a local minimum value around the edge area of the memory cell hole, and an oxygen concentration in the first variable resistance layer is higher than an oxygen concentration in the second variable resistance layer, a variable resistance element in which a first wiring pattern is formed above the substrate, the memory cell hole is formed to penetrate through the interlayer insulating layer and to reach an upper surface of the first wiring pattern, and the first electrode is formed at least at the bottom of the memory cell hole and above the first wiring pattern. The following describes specifically the variable resistance element according to Embodiment 4 of the present invention.

Figure 11:
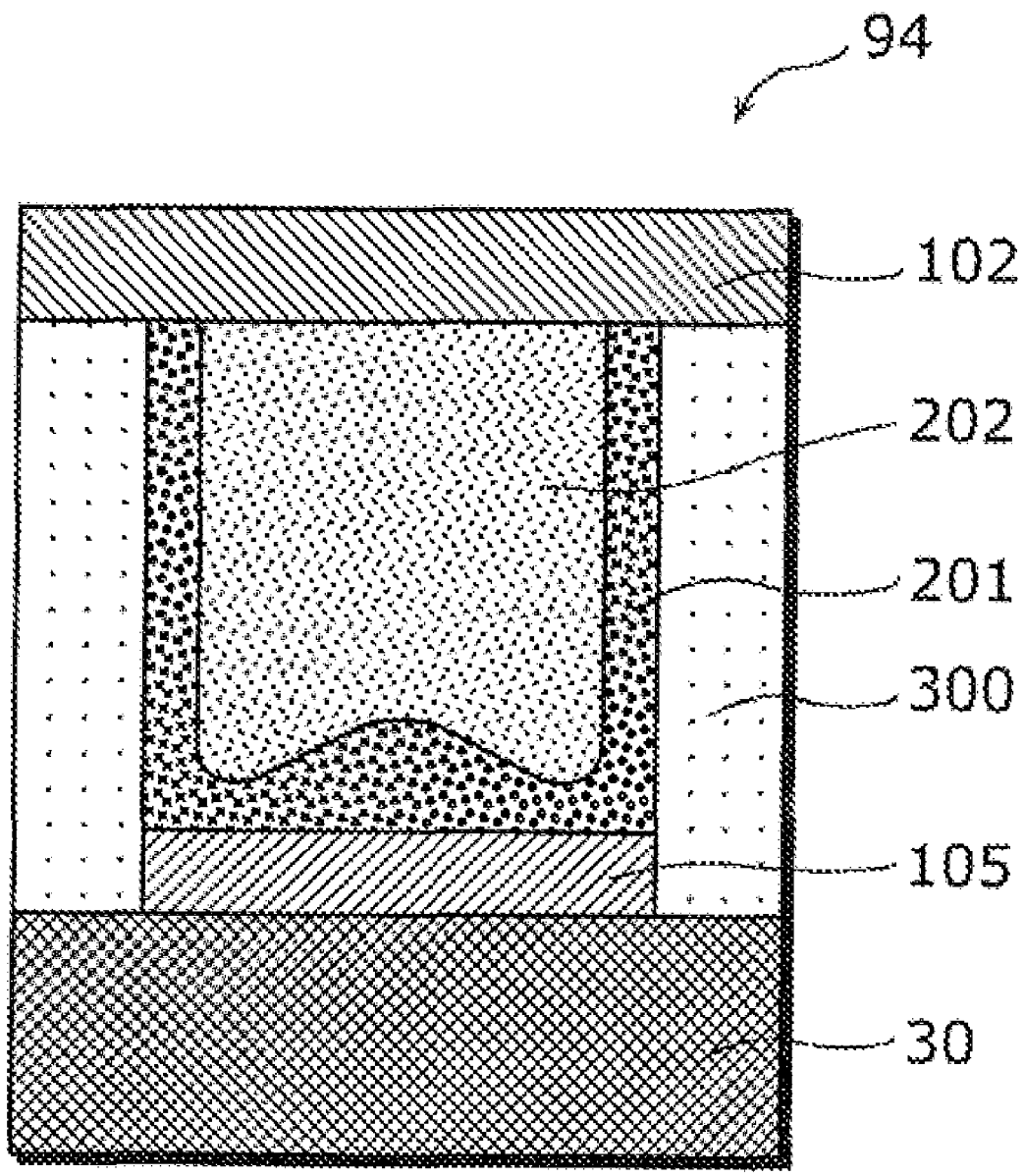
FIG. 11 is a cross sectional view of an example of a configuration of a variable resistance element according to Embodiment 4 of the present invention.

FIG. 11 is a cross sectional view which shows an example of a variable resistance element 94 according to Embodiment 4 of the present invention.

The difference between the variable resistance element 94 according to the present embodiment and the variable resistance element 92 according to Embodiment 2 is that, whereas the first electrode 103 is formed on the entire upper surface of the first wiring pattern 10 in FIG. 9, the first electrode 105 is formed only on the upper surface of the first wiring pattern 30 in the bottom of the memory cell hole in FIG. 11.

Figure 12:
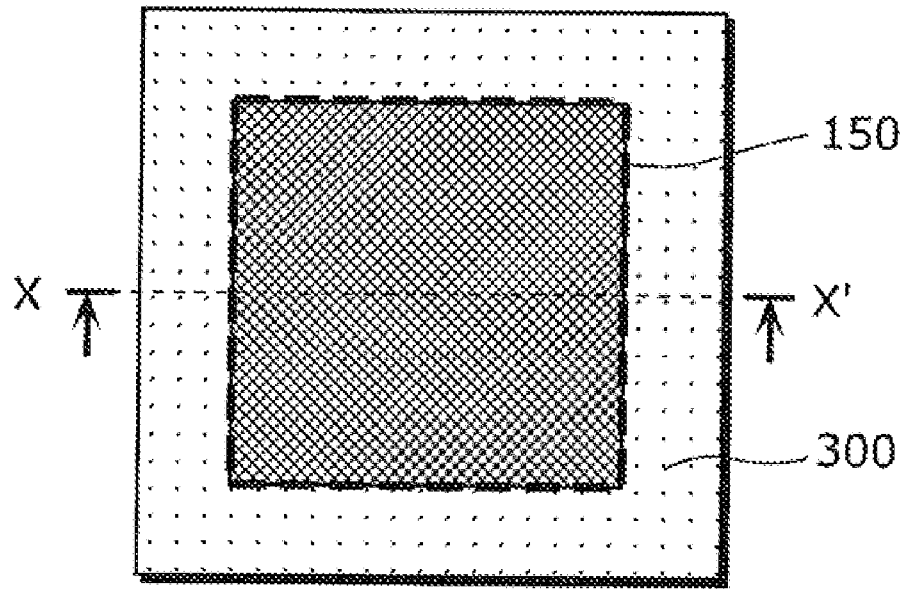
FIG. 12(a) is a plan view showing a process of forming a memory cell hole in a manufacturing method of variable resistance element according to Embodiment 4 of the present invention.
FIG. 12(b) is a cross sectional view of FIG. 12(a).
Figure 12:
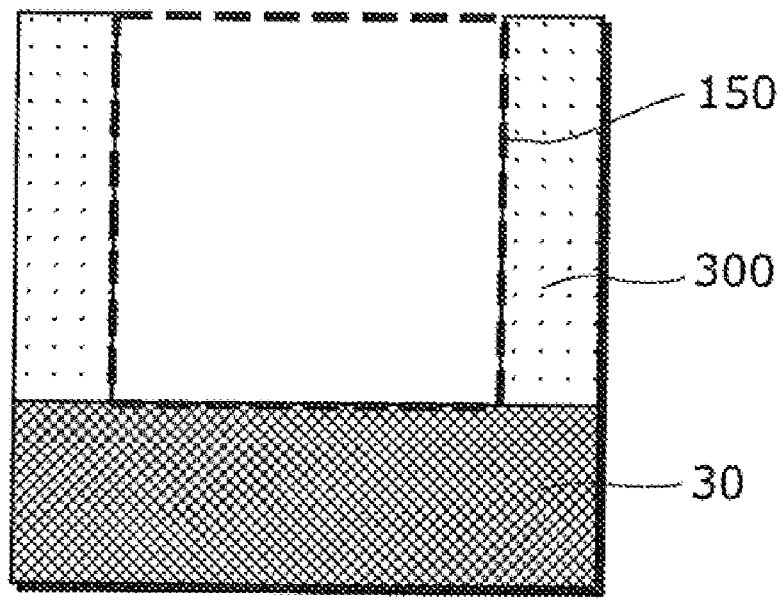
Figure 13:
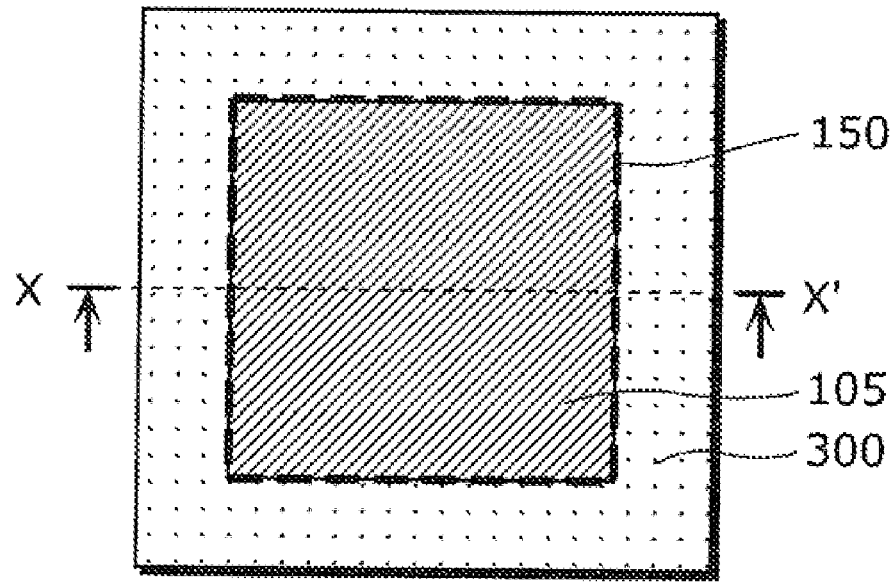
FIG. 13(a) is a plan view showing a process of forming a first electrode in the manufacturing method of the variable resistance element according to Embodiment 4 of the present invention.
FIG. 13(b) is a cross sectional view of FIG. 13(a).
Figure 13:
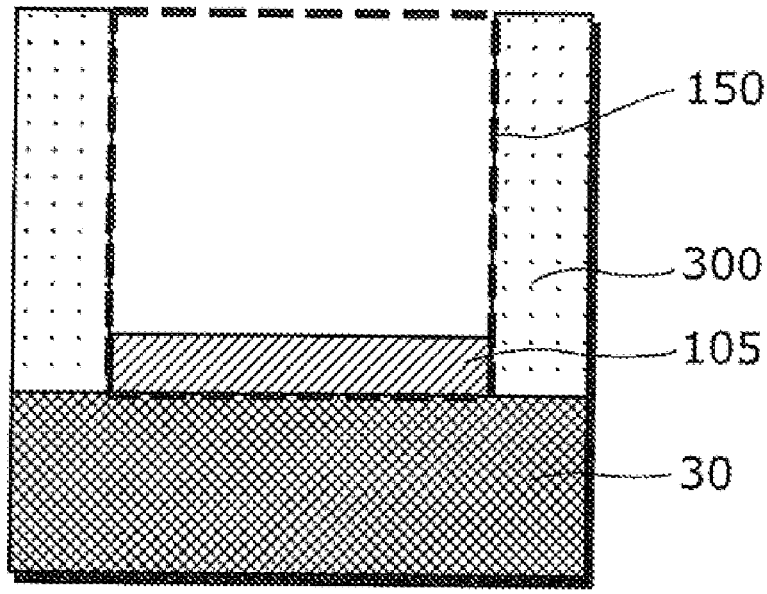
Figure 14:
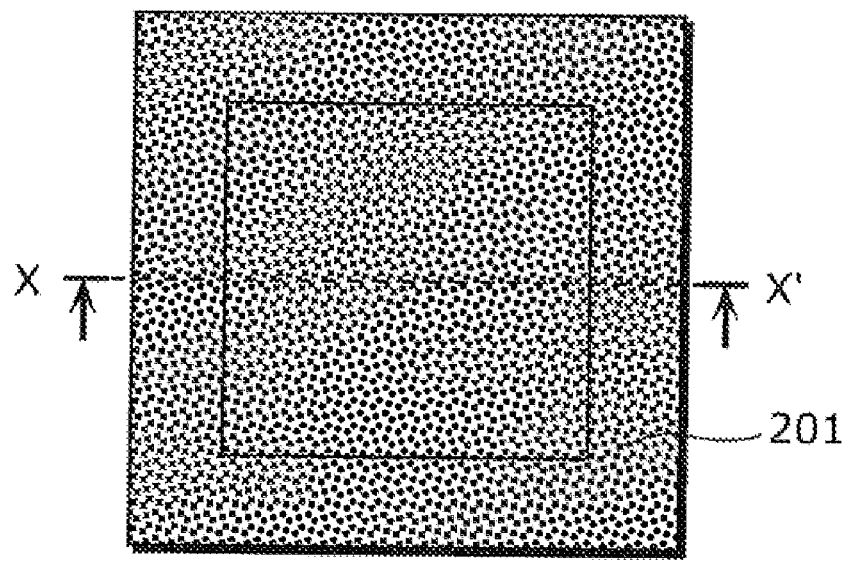
FIG. 14(a) is a plan view showing a process of forming a first variable resistance layer in the manufacturing method of the variable resistance element according to Embodiment 4 of the present invention.
FIG. 14(b) is a cross sectional view of FIG. 14(a).
Figure 14:
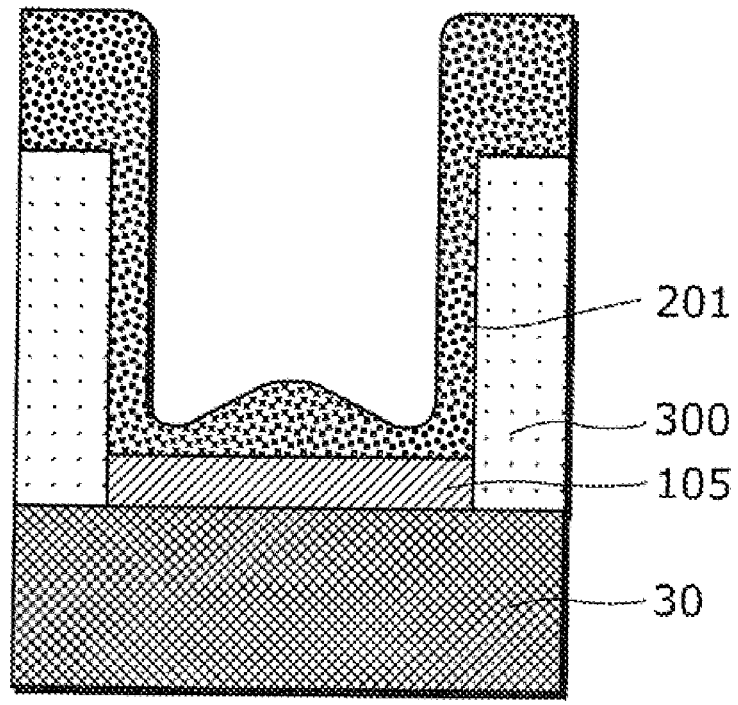

The following describes a manufacturing method of the variable resistance element 94 according to Embodiment 4, with reference to FIGS. 12(a) and (b) to FIGS. 14(a) and (b). In each diagram, (a) is a plan view and (b) is a cross sectional view of (a) taken along the line X-X' viewed from a direction of the arrows.

First, the first wiring pattern 30 is formed above a substrate (not illustrated). For this formation, a wiring pattern including Al, Al—Cu alloy, Ti—Al—N alloy, or the like used in a wiring processing of general semiconductor processes, or a Cu wiring pattern formed by damascene process can be used.

In the present embodiment, a Cu wiring pattern deposited by the damascene method and having the Cu thickness of 200 nm and wiring pattern width of approximately 1.0 µm is used.

Next, the interlayer insulating layer 300 including TEOS-SiO is deposited for the thickness of 800 nm using the CVD, for example, and the interlayer insulating layer on the first wiring pattern 30 is polished to have the thickness of 300 nm using a chemical mechanical polishing (CMP), for example, thereby roughly planarizing the surface.

It is to be noted that a silicon nitride (SiN) film, a silicon carbon nitride (SiCN) film which is a low dielectric constant material, a silicon-oxycarbite (SiOC) film, a fluorine-doped silicon oxide (SiOF) film, or the like may be used for the interlayer insulating layer 300, other than the TEOS-SiO. In addition, a stacking configuration may be employed using these materials.

Then, the memory cell hole 150 that reaches the upper surface of the first wiring pattern 30 is formed on the interlayer insulating layer 300 as shown in FIG. 12(b). More specifically, the memory cell hole 150 is formed in the interlayer insulating layer 300 and a part of the upper surface of the first wiring pattern 30 is exposed to the bottom of the memory cell hole 150. The formation of the above can easily be achieved using a technology used in ordinary semiconductor processes (photolithography, etching, and so on).

Next, the first electrode 105 is formed on the first wiring pattern 30 exposed to the bottom of the memory cell hole 150 using a selective electroless plating deposition, for example.

In the present embodiment, Pt is used for the first electrode 105 and a hydrazine-ammonia system Pt plating bath or a Pt plating bath including, as a reducing agent, a boron compound or a hypophosphorous acid may be used for electroless Pt plating bath. In addition, it is desirable that the thickness for a Pt electrode film is approximately 5 nm to 50 nm, and the thickness is set at 25 nm in the present embodiment. Furthermore, selective deposition can be carried out more efficiently by forming a seed layer in advance on the upper surface of the first wiring pattern 30. Nickel, a nickel-phosphorus alloy or a nickel-boron alloy may be used for the seed layer.

Next, the first variable resistance layer 201 is deposited in the memory cell hole 150 to cover the surface of the interlayer insulating layer 300 as shown in FIGS. 14(a) and (b), which can be formed in the same manner as in FIGS. 3(a) and (b) in Embodiment 1. Subsequent forming processing is the same as in Embodiment 1, and thus the description therefor is omitted.

The configuration according to the present embodiment eliminates the necessity of patterning process using etching process of noble metals such as Pt, Pd, Ir, or the like used for the material of the first electrode 105, and thus advantageous effects described below can be obtained. It is difficult to fabricate an etched sidewall of noble metals used for the material of the first electrode vertically to the substrate, using general dry etching processing in which reactive ion etching or the like is used. In addition, it is difficult to perfectly remove an adhesive material after etching because a vapor pressure of a product of reaction with etching gas is high. Thus, a short circuit caused by an adhesive material in a fine pattern or deterioration in a shape of a fine wiring pattern occurs easily, producing a problem for miniaturization. According to the present embodiment, such problem does not occur because patterning process for noble metal is not necessary, producing advantageous effect that miniaturization is facilitated. In addition, since a noble metal electrode is selectively formed only on the bottom of the memory cell hole, the use amount of noble metal material can be reduced and utilization ratio is improved, producing an advantageous effect of enabling manufacturing at low costs even when the noble metal electrode is used.

(Embodiment 5)

Figure 15:
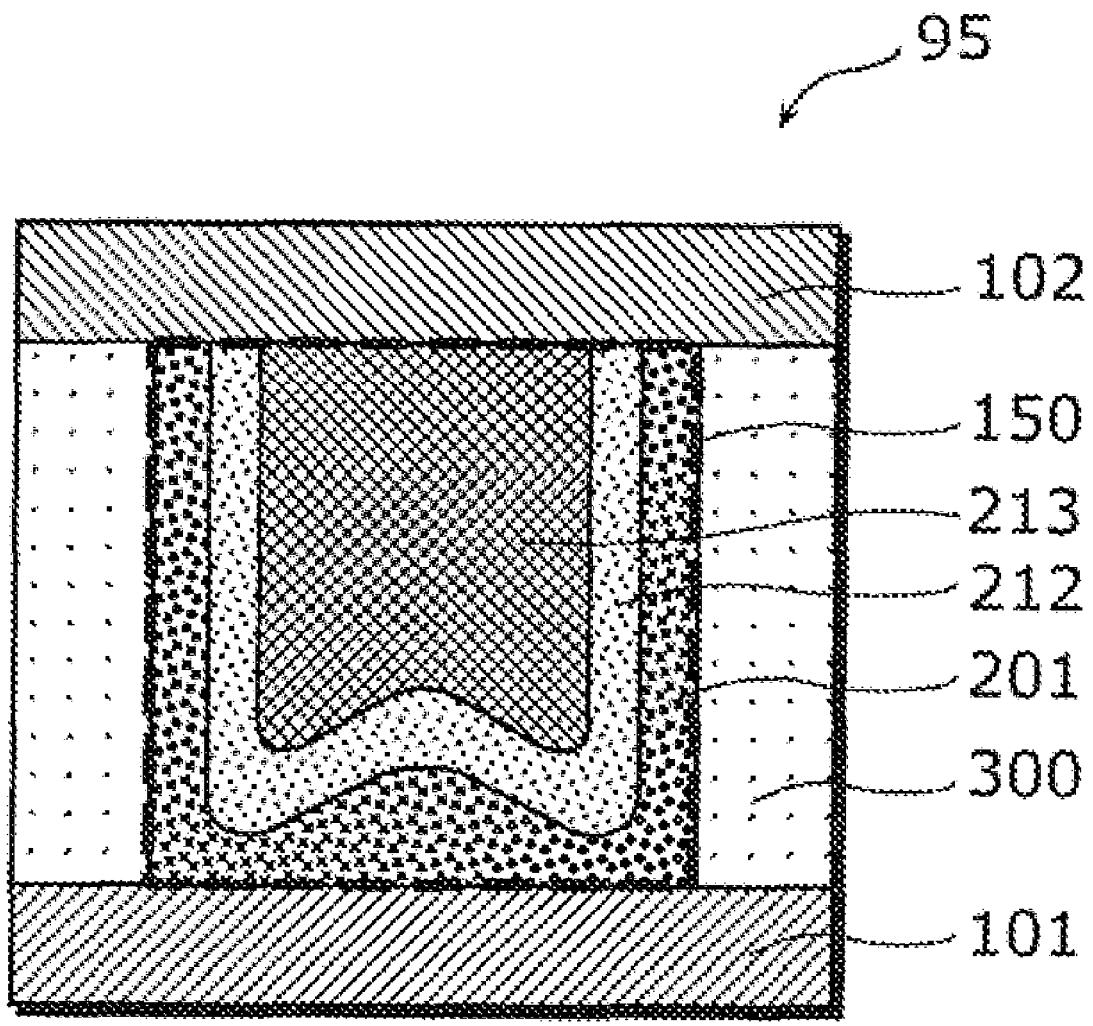
FIG. 15 is a cross sectional view of an example of a configuration of a variable resistance element according to Embodiment 5 of the present invention.

FIG. 15 is a cross sectional view which shows an example of a variable resistance element 95 according to Embodiment 5 of the present invention.

The difference between the variable resistance element 95 according to the present embodiment and the variable resistance element 91 according to Embodiment 1 is that a filled layer 213 is further filled on the second variable resistance layer 212 that is filled in the memory cell hole 150.

Figure 16:
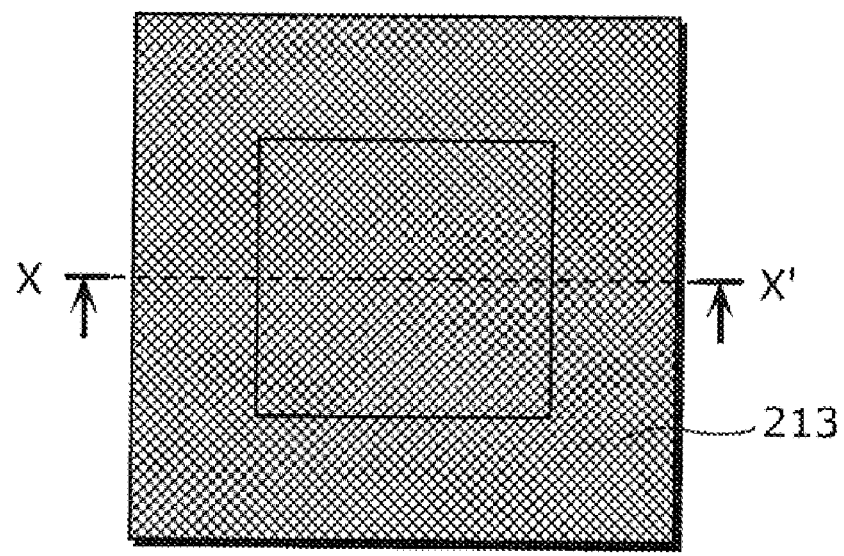
FIG. 16(a) is a plan view showing a process of forming a first variable resistance layer, a second variable resistance layer, and a filled layer in the manufacturing method of the variable resistance element according to Embodiment 5 of the present invention.
FIG. 16(b) is a cross sectional view of FIG. 16(a).
Figure 16:
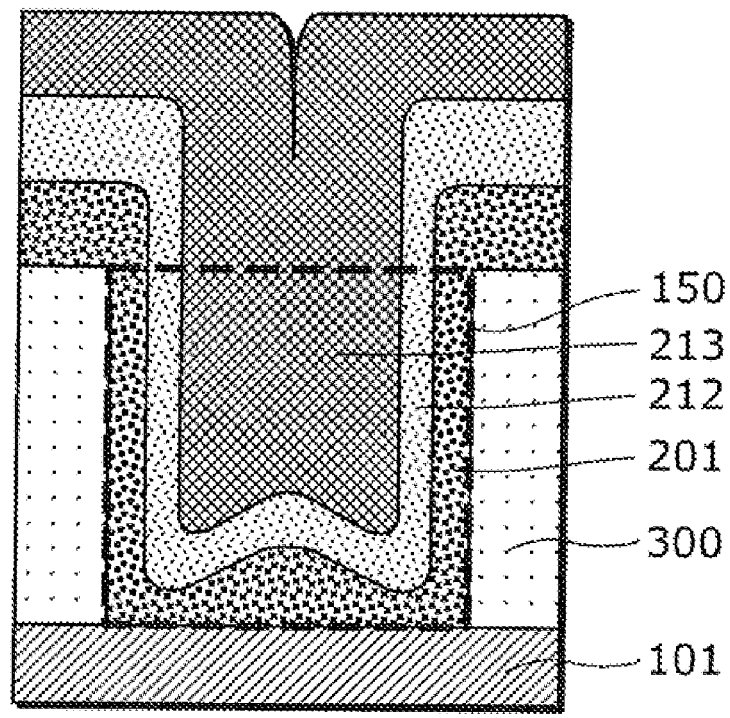
Figure 18:
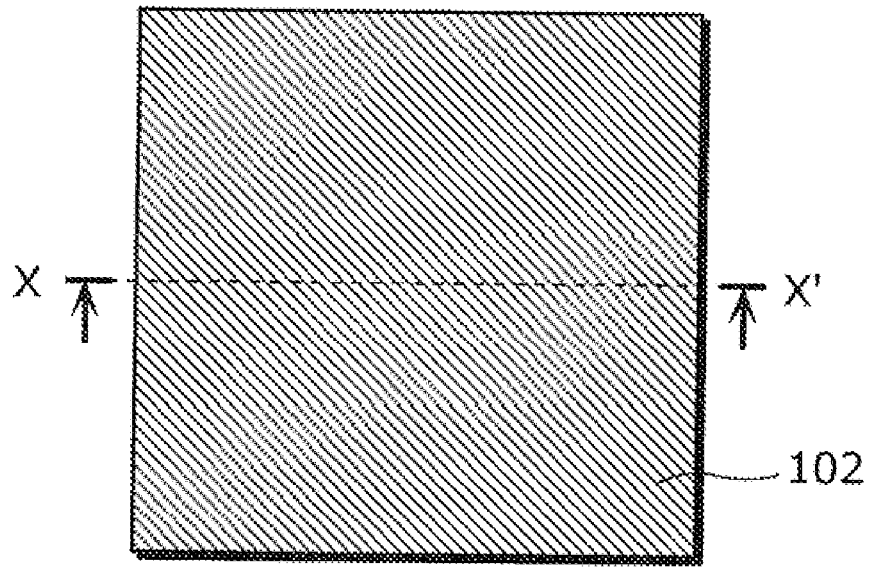
FIG. 18(a) is a pattern diagram of an upper surface showing a process of forming a second electrode in the manufacturing method of the variable resistance element according to Embodiment 5 of the present invention.
FIG. 18(b) is a cross sectional view of FIG. 18(a).
Figure 18:
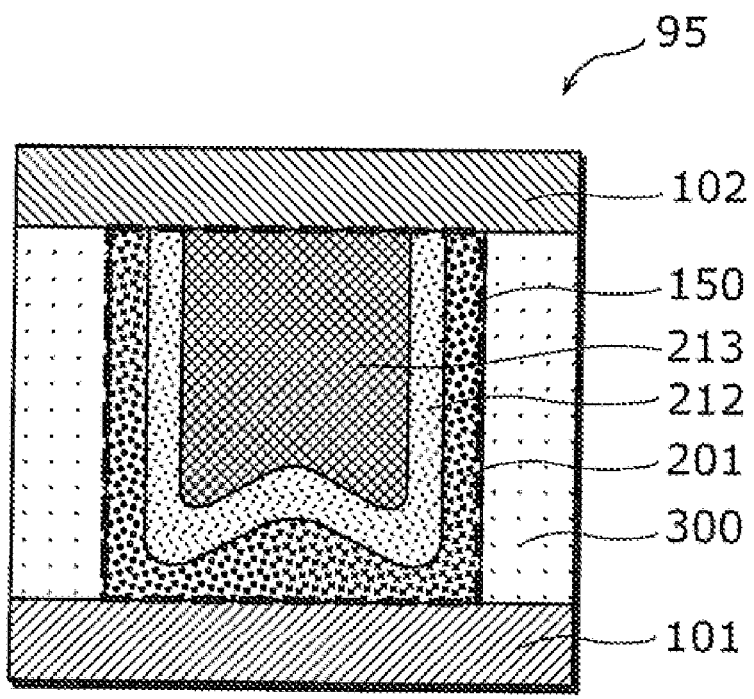

The following describes a manufacturing method of the variable resistance element 95 according to Embodiment 5, with reference to FIGS. 16(a) and (b) to FIGS. 18(a) and (b). In each diagram, (a) is a plan view and (b) is a cross sectional view of (a) taken along the line X-X' viewed from a direction of the arrows.

Forming process from the start to depositing the first variable resistance layer 201 (FIGS. 3(a) and (b)) is the same as in the Embodiment 1, the same name is applied to components common in Embodiment 1 and Embodiment 5, and the description therefor is omitted.

First, the second variable resistance layer 212 having an oxygen content lower than that of the first variable resistance layer 201 is deposited on the surface shown in FIGS. 3(a) and (b) using the same method as in the film formation of the first variable resistance layer 201. At this time, it is preferable that a film to be deposited covers uniformly the surface of the first variable resistance layer 201 at the bottom of the memory cell hole. Thus, it is preferable that the tilt angle of the substrate at the time of deposition is approximate to 0°, and the deposition film has the thickness of 10 nm to 100 nm on the first variable resistance layer 201 at the bottom of the memory cell hole. The tilt angle is set at 0° and the deposition thickness on the first variable resistance layer 201 at the bottom of the memory cell hole is set at 50 nm according to the present embodiment.

Further, the filled layer 213 is deposited on the second variable resistance layer 212 such that the memory cell hole 150 is completely filled (FIGS. 16(a) and (b)).

It is desirable that the same material as that for the second electrode 102 in Embodiment 1 is used for the material for the filled layer (conductive layer) 213, and a film formation method with high filling performance such as long throw sputtering method and CVD method is used.

In the present embodiment, tungsten (W) is used for the filled layer 213 and the thickness for the film formation is 400 nm when measured on a flat substrate.

Next, the entire surface is roughly planarized by polishing and removing the filled layer 213 using the CMP, the second variable resistance layer 212, and the first variable resistance layer 201 on the surface of the interlayer insulating layer 300 other than the memory cell hole 150, and the filled layer 213, the second variable resistance layer 212, and the first variable resistance layer 201 are formed in the memory cell hole 150 (FIGS. 17(a) and (b)).

In the CMP at this time, it is desirable that the polishing rates of the filled layer 213, the second variable resistance layer 212, and the first variable resistance layer 201 are higher than the polishing rate of the interlayer insulating layer 300, from the standpoint of processing stability. In the present embodiment, acidic slurry is used that is generally used in the CMP for tungsten (W).

Figure 17:
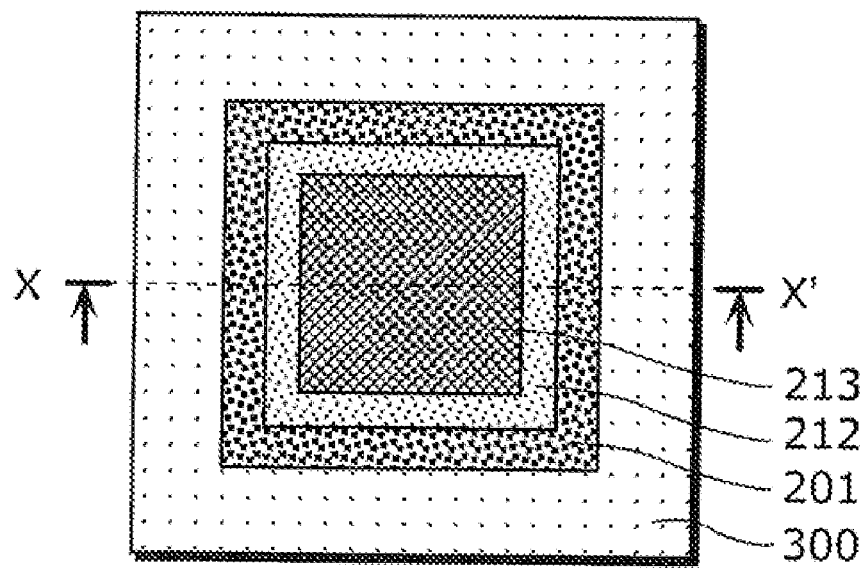
FIG. 17(a) is a plan view showing a process of forming a first variable resistance layer, a second variable resistance layer, and a filled layer in the manufacturing method of the variable resistance element according to Embodiment 5 of the present invention.
FIG. 17(b) is a cross sectional view of FIG. 17(a).
Figure 17:
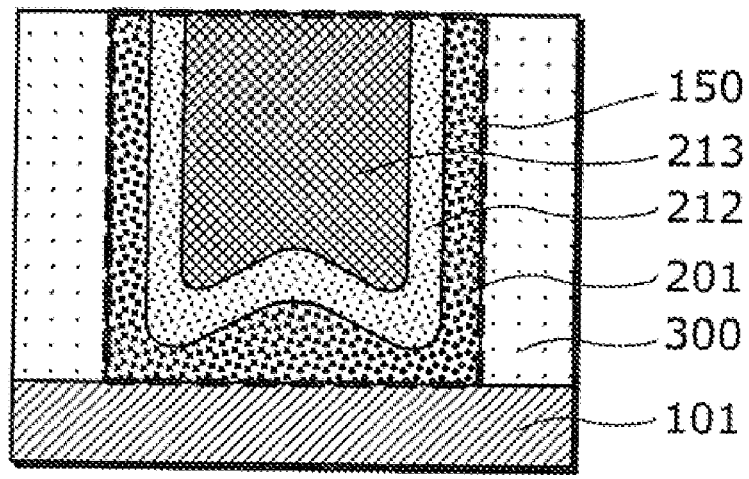

Next, the second electrode 102 is formed on the surface shown in FIGS. 17 (a) and (b) as shown in FIGS. 18(a) and (b). This forming processing is the same as in the processing of FIGS. 5(a) and (b) of Embodiment 1, and thus the description therefor is omitted.

With the configuration described in Embodiment 1 to Embodiment 4, since the second variable resistance layer is deposited so as to fill up the entire memory cell hole, the deposition thickness of the second variable resistance layer needs to be increased according to the height of the memory cell hole. However, with the configuration including the filled layer, it is possible to set the thickness of the second variable resistance layer 212 irrespective of the height of the memory cell hole 150, thereby allowing the thickness of the second variable resistance layer 212 to be thinner than that in Embodiment 1. This also allows an effective thickness of the second variable resistance layer 212 when applying a voltage between the first electrode 101 and the second electrode 102 to be thinner, producing an advantageous effect that the initial breakdown voltage can be reduced.

The variable resistance element and manufacturing method thereof according to the present invention have been described above. However, the present invention is not limited to the embodiments. Other forms in which various modifications apparent to those skilled in the art are applied to the embodiments, or forms structured by combining elements of different embodiments are included within the scope of the present invention, unless such changes and modifications depart from the scope of the present invention.

For example, the configuration in which the filled layer (conductive layer) is formed in the second variable resistance layer as in Embodiment 5 can be applied to the configurations according to Embodiment 1 to. Embodiment 4 (FIG. 1, FIG. 9, FIG. 10, and FIG. 11) to produce the same function effects described above.

Furthermore, the oxygen-deficient transition metal oxide which forms the first variable resistance layer and the second variable resistance layer is a tantalum oxide in the embodiments above, however, the first variable resistance layer and the second variable resistance layer included in the variable resistance element according to the present invention are not limited to this material, and it is only necessary to include at least one selected from the tantalum oxide, a hafnium oxide, and a zirconium oxide.

In other words, the variable resistance layer is formed of the tantalum oxide in a stacking configuration in the embodiments above, however, the above-described function effects of the present invention are produced not only in the case of the tantalum oxide, and the present invention is not limited to this. For example, a stacking configuration formed of a hafnium (Hf) oxide or a stacking configuration formed of a zirconium (Zr) oxide may be employed.

In the case where the stacking configuration formed of the hafnium oxide is employed, when the composition of the first hafnium oxide is represented by $HfO_y$ and the composition of the second hafnium oxide is represented by $HfO_x$, it is preferable that x is approximately $0.9 \leq x \leq 1.6$, y is approximately $1.8 \leq y \leq 2.0$, and the thickness of the first hafnium oxide is 3 nm or larger and 4 nm or smaller at a portion having a local minimum value.

Furthermore, in the case where the stacking configuration formed of the zirconium oxide is employed, when the composition of the first zirconium oxide is represented by $ZrO_y$, and the composition of the second zirconium oxide is represented by $ZrO_x$, it is preferable that x is approximately $0.9 \leq x \leq 1.4$, y is approximately $1.9 \leq y \leq 2.0$, and the thickness of the first zirconium oxide is 1 nm or larger and 5 nm or smaller at a portion having a local minimum value.

Furthermore, in the case of the hafnium oxide, sputtering is performed with the hafnium used as the target in gas including argon gas and oxygen gas, and the oxygen content of the first hafnium oxide layer and the second hafnium oxide layer can be easily adjusted by changing a flow ratio of the oxygen gas to the argon gas in sputtering as in the case of the tantalum oxide described above. It is to be noted that the substrate does not have to be heated and the temperature of the substrate may be set at an ambient temperature.

In the case of the zirconium oxide, sputtering is performed with the zirconium used as the target in gas including argon gas and oxygen gas, and the oxygen content of the first zirconium oxide layer and the second zirconium oxide layer can be easily adjusted by changing a flow ratio of the oxygen gas to the argon gas in sputtering as in the case of the tantalum oxide described above It is to be noted that the substrate does not have to be heated and the temperature of the substrate may be set at an ambient temperature.

Industrial Applicability

The variable resistance element and the non-volatile semiconductor storage device using the same according to the present invention are capable of operating with high integration at low power and high speed, have characteristics of stable writing and reading, and are useful as non-volatile semiconductor storage devices used for various electric devices such as digital appliances, memory cards, mobile phones, and personal computers.

REFERENCE SIGNS LIST 1 substrate
10 lower wiring pattern
20 upper wiring pattern
30 first wiring pattern
91 to 95 variable resistance element
101, 103, 105 first electrode
102, 104 second electrode
150 memory cell hole
201 first variable resistance layer
202, 212 second variable resistance layer
213 filled layer
300 interlayer insulating layer

The invention claimed is:

1. A variable resistance element comprising:
a substrate;
a first electrode formed above said substrate;
an interlayer insulating layer formed above said substrate;
a first variable resistance layer formed on said first electrode in a memory cell hole that is formed to penetrate through said interlayer insulating layer;
a second variable resistance layer formed on said first variable resistance layer in the memory cell hole; and
a second electrode covering at least a top of the memory cell hole and electrically connected to at least said second variable resistance layer,
wherein an electrical resistance value between said first electrode and said second electrode changes in response to application of a predetermined voltage or current between said first electrode and said second electrode,
a thickness of said first variable resistance layer at a bottom of the memory cell hole gradually decreases from a center area toward an edge area of the memory cell hole and has a local minimum value around the edge area of the memory cell hole, and
an oxygen concentration in said first variable resistance layer is higher than an oxygen concentration in said second variable resistance layer.

2. The variable resistance element according to claim 1, wherein said interlayer insulating layer is formed above said first electrode, and
the memory cell hole is formed to penetrate through said interlayer insulating layer and to reach an upper surface of said first electrode.

3. The variable resistance element according to claim 1 further comprising
a first wiring pattern formed above said substrate,
wherein the memory cell hole is formed to penetrate through said interlayer insulating layer and to reach an upper surface of said first wiring pattern, and
said first electrode is formed at least at the bottom of the memory cell hole and above said first wiring pattern.

4. The variable resistance element according to claim 1, wherein a resistance value of said variable resistance element before a first operation immediately after manufacture is higher than a resistance value of said variable resistance element in a high resistance state during a resistance changing operation.

5. The variable resistance element according to claim 1, further comprising
a filled conductive layer formed on said second variable resistance layer in the memory cell hole,
wherein said second electrode is electrically connected to at least said filled conductive layer and said second variable resistance layer.

6. The variable resistance element according to claim 1, wherein a lower surface of said first electrode is connected to an upper surface of a wiring pattern formed below said first electrode.

7. The variable resistance element according to claim 1, wherein an upper surface of said second electrode is connected to a lower surface of a wiring pattern formed above said second electrode.

8. The variable resistance element according to claim 1, wherein said first electrode includes platinum, palladium, iridium, or a mixture of platinum, palladium, and iridium.

9. The variable resistance element according to claim 1, wherein said second electrode includes at least one selected from: copper, titanium, tungsten, tantalum, titanium nitride, tungsten nitride, and tantalum nitride.

10. The variable resistance element according to claim 1, wherein said first variable resistance layer and said second variable resistance layer include an oxygen-deficient transition metal oxide, and
the oxygen-deficient transition metal oxide is an oxide of tantalum, hafnium, or zirconium.

11. A method of manufacturing a variable resistance element, said method comprising:
forming a first electrode above a substrate;
depositing an interlayer insulating layer above the substrate and the first electrode;
forming a memory cell hole in the interlayer insulating layer such that an upper surface of the first electrode is exposed to a bottom of the memory cell hole;
depositing a first variable resistance layer on the bottom and side wall of the memory cell hole and on the interlayer insulating layer, the first variable resistance layer having, at the bottom of the memory cell hole, a thickness that gradually decreases from a center area toward an edge area of the memory cell hole and having a local minimum value around the edge area of the memory cell hole;
depositing a second variable resistance layer on the first variable resistance layer;
removing the first variable resistance layer and the second variable resistance layer deposited above the interlayer insulating layer, using chemical mechanical polishing, to form the first and second variable resistance layers in the memory cell hole; and
forming a second electrode above the memory cell hole and the interlayer insulating layer after said removing using the chemical mechanical polishing.

12. A method of manufacturing a variable resistance element, said method comprising:
forming a first wiring pattern above a substrate;
depositing an interlayer insulating layer above the substrate and the first wiring pattern;
forming a memory cell hole in the interlayer insulating layer such that an upper surface of the first wiring pattern is exposed to a bottom of the memory cell hole;
forming a first electrode at the bottom of the memory cell hole and on the upper surface of the first wiring pattern;
depositing a first variable resistance layer at the bottom of the memory cell hole and on the first electrode, and on the side wall of the memory cell hole and on the interlayer insulating layer, the first variable resistance layer having, at the bottom of the memory cell hole, a thickness that gradually decreases from a center area toward an edge area of the memory cell hole and having a local minimum value around the edge area of the memory cell hole;
depositing a second variable resistance layer on the first variable resistance layer; removing the first variable resistance layer and the second variable resistance layer deposited above the interlayer insulating layer, using chemical mechanical polishing, to form the first and second variable resistance layers in the memory cell hole; and
forming a second electrode above the memory cell hole and the interlayer insulating layer after said removing using the chemical mechanical polishing.

13. The method of manufacturing a variable resistance element according to claim 12,
wherein the first electrode is formed using plating.

14. The method of manufacturing a variable resistance element according to claim 11, further comprising
forming a filled conductive layer on the second variable resistance layer after said depositing of a second variable resistance layer on the first variable resistance layer,
wherein in said removing using chemical mechanical polishing, the filled conductive layer is removed using chemical mechanical polishing in addition to the first variable resistance layer and the second variable resistance layer deposited above the interlayer insulating layer, to form the first and second variable resistance layers and the filled conductive layer.

15. The method of manufacturing a variable resistance element according to claim 11,
wherein said forming of a memory cell hole includes forming the memory cell hole having an opening size denoted by "a" at a top surface and a height denoted by "b" in the interlayer insulating layer, the memory cell hole, and
said depositing of a first variable resistance layer includes depositing a material of the first variable resistance layer on the interlayer insulating layer and in the memory cell hole, by tilting the substrate from a state in which a surface of the substrate is vertical with respect to a deposit direction of deposited molecules, by more than 0° and arc tangent of a/2b or less, and causing the substrate to rotate, using sputtering having a high directivity in the deposit direction of the deposited molecules, as a method for depositing the first variable resistance layer.

* * * * *